(12) United States Patent
Yamagishi

(10) Patent No.: US 9,128,146 B2
(45) Date of Patent: Sep. 8, 2015

(54) SEMICONDUCTOR INTEGRATED CIRCUIT

(75) Inventor: Toshiyuki Yamagishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 505 days.

(21) Appl. No.: 13/422,561

(22) Filed: Mar. 16, 2012

(65) Prior Publication Data

US 2013/0147501 A1      Jun. 13, 2013

(30) Foreign Application Priority Data

Dec. 7, 2011  (JP) .................. 2011-267942

(51) Int. Cl.
G01R 31/26        (2014.01)
G01R 31/28        (2006.01)
G01R 31/317       (2006.01)

(52) U.S. Cl.
CPC ...... *G01R 31/2884* (2013.01); *G01R 31/31726* (2013.01)

(58) Field of Classification Search
CPC ............... G01R 31/31725; G01R 31/2882; G01R 31/3016; G01R 31/2853; G01R 31/318516; G01R 31/2621; G01R 31/31707; G01R 31/31715; G01R 31/31718; G01R 31/31937; G01R 31/2884; G01R 31/31726; G01R 31/3177; G01R 31/318505; G01R 31/318511; G01R 29/26; G01R 31/31721; G01R 19/16552; G01R 23/15; G06F 1/10; G06F 1/3234; G06F 21/64; G06F 1/04; G06F 1/26; G06F 1/3237; G06F 1/3296; H03B 19/00; H03B 5/04; H03B 5/06; H03B 5/1293; H03B 5/36; H03K 5/13; H03K 5/131–5/135; G04F 10/00; G04F 10/02; G04F 10/06; H03L 7/085; H03L 7/0991; H03L 7/113; H03L 2207/06; H03L 7/0891; H03L 7/0996; H03L 7/18; H03L 7/23; H02M 2001/0032; Y02B 60/1225; Y02B 60/1217; Y02B 60/1221; Y02B 70/16

See application file for complete search history.

(56) References Cited

U.S. PATENT DOCUMENTS 7,042,971 B1 *  5/2006  Flanagan et al. .............. 375/376
8,786,347 B1 *  7/2014  Chakraborty et al. ........ 327/265

(Continued)

FOREIGN PATENT DOCUMENTS

JP      2003-121505     4/2003
JP      2007-93476      4/2007

(Continued)

OTHER PUBLICATIONS

Tetsuya Iizuka, et al., "All-Digital On-Chip Monitor for PMOS and NMOS Process Variability Measurement Utilizing Buffer Ring with Pulse Counter", In Proceedings of IEEE European Solid-State Circuit Conference, IEICE Transactions on Electronics, vol. E94-C, No. 4, 2010, pp. 182-185.

(Continued)

*Primary Examiner* — Vinh Nguyen
(74) *Attorney, Agent, or Firm* — Oblon, McClelland, Maier & Neustadt, L.L.P.

(57) ABSTRACT

According to one embodiment, there is provided a semiconductor integrated circuit including an on-chip measurement circuit. The measurement circuit includes a buffer line, a ring oscillator, a first measurement unit measuring a duty cycle of a periodic pulse output from the buffer line, and a second measurement unit measuring a frequency of a periodic pulse output from the ring oscillator. The buffer line including a plurality of delay elements connected in series. Each of the plurality of delay elements includes a former-stage inverter unit including a PMOS transistor and an NMOS transistor and having a first delay amount, and a latter-stage inverter unit including a PMOS transistor and an NMOS transistor and having a second delay amount different from the first delay amount.

1 Claim, 20 Drawing Sheets

(56) References Cited

U.S. PATENT DOCUMENTS

2004/0068674 A1* 4/2004 Rodriguez et al. .............. 714/25
2008/0278223 A1* 11/2008 Kernahan et al. ............. 327/538
2011/0187419 A1* 8/2011 Ikenaga et al. ................ 327/117

FOREIGN PATENT DOCUMENTS

JP 2010-66019 3/2010
JP 2010-283054 A 12/2010

OTHER PUBLICATIONS

H. Notani, et al., "On-chip Digital $I_{dn}$ and $I_{dp}$ Measurement by 65 nm CMOS Speed Monitor Circuit", IEEE Asian Solid-State Circuits Conference, Nov. 3-5, 2008, pp. 405-408.

Japanese Office Action issued on Jan. 6, 2015 in Patent Application No. 2011-267942 with English translation.

* cited by examiner

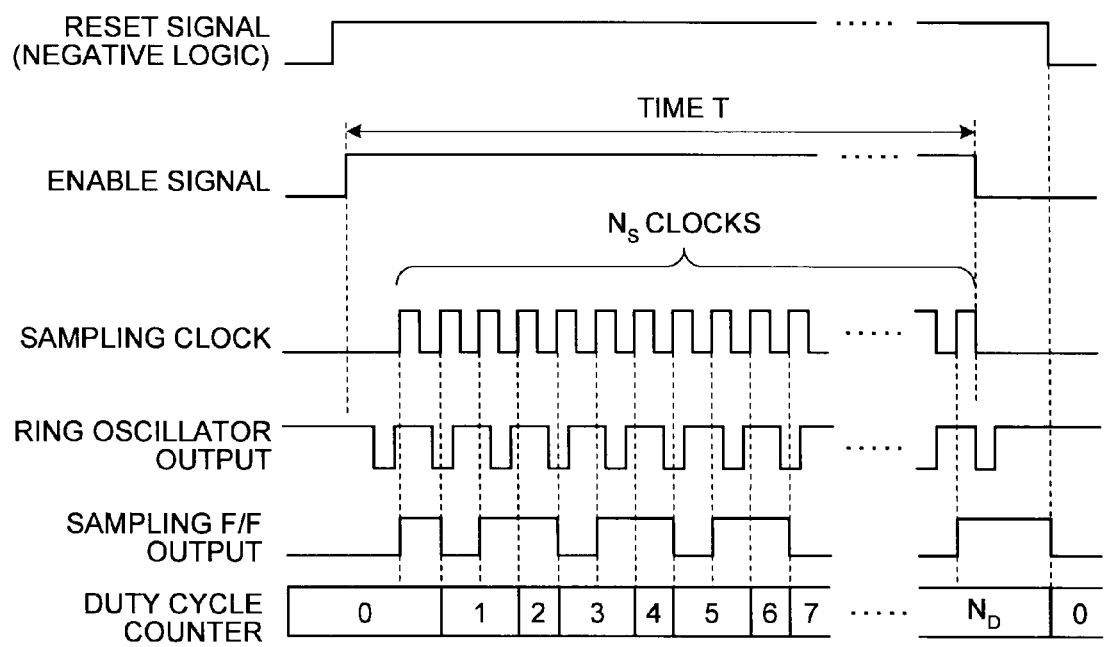

SEMICONDUCTOR INTEGRATED CIRCUIT

CROSS-REFERENCE TO RELATED APPLICATIONS

This application is based upon and claims the benefit of priority from Japanese Patent Application No. 2011-267942, filed on Dec. 7, 2011; the entire contents of which are incorporated herein by reference.

FIELD

Embodiments described herein relate generally to a semiconductor integrated circuit.

BACKGROUND

In recent years, with the miniaturization of semiconductor devices, variations in the characteristics of devices have been increased, and therefore it is becoming difficult to secure a margin of operating frequency of and ensure power consumption of a digital circuit unit on a semiconductor integrated circuit. Moreover, also in terms of an analog circuit, since the power supply voltage has been decreased due to recent years' decrease in power consumption, it is becoming difficult to design a reference voltage generation circuit or reference current generation circuit for counteracting variations in the characteristics of devices and ensuring a fixed output.

It is known that a substrate voltage control technique is effective for securing a margin of operating frequency of and ensuring power consumption of a digital circuit. This is a technique that reduces variations in the characteristics of devices by changing the substrate voltages of chips whose operating frequency and power consumption deviate from the specifications, and aims to obtain characteristics close to the specifications. A variation reduction method for an analog circuit depends on the content of each circuit. As an example, in terms of a digital-to-analog converter, if a reference voltage generation circuit cannot reduce variations in the characteristics of PMOS transistors and NMOS transistors, the amplitude of an output depends on the characteristic variation and varies. In this case, a digital code inputted to the digital-to-analog converter is multiplied in advance by a correction parameter in accordance with the characteristic variations of PMOS and NMOS transistors; accordingly, the influence of the characteristic variations can be reduced. It is necessary to separately estimate the characteristic variations of PMOS and NMOS transistors for each chip in order to execute the correction process.

BRIEF DESCRIPTION OF THE DRAWINGS

FIG. 6 is a view illustrating operations related to duty cycle measurement in the first embodiment;

DETAILED DESCRIPTION

In general, according to one embodiment, there is provided a semiconductor integrated circuit including an on-chip measurement circuit. The measurement circuit includes a buffer line, a ring oscillator, a first measurement unit measuring a duty cycle of a periodic pulse output from the buffer line, and a second measurement unit measuring a frequency of a periodic pulse output from the ring oscillator. The buffer line including a plurality of delay elements connected in series. Each of the plurality of delay elements includes a former-stage inverter unit including a PMOS transistor and an NMOS transistor and having a first delay amount, and a latter-stage inverter unit including a PMOS transistor and an NMOS transistor and having a second delay amount different from the first delay amount.

Exemplary embodiments of a semiconductor integrated circuit will be explained below in detail with reference to the accompanying drawings. The present invention is not limited to the following embodiments.

First Embodiment

A description will be given of a semiconductor integrated circuit 1 according to a first embodiment.

The semiconductor integrated circuit 1, for example, is a circuit mounted on one semiconductor substrate (semiconductor chip), and includes a predetermined circuit, such as a digital circuit, an analog circuit, and a digital-to-analog converter, as well as includes an on-chip measurement circuit 100 mounted on the same semiconductor substrate (semiconductor chip) as the predetermined circuit. The predetermined circuit and the on-chip measurement circuit 100 include PMOS and NMOS transistors manufactured by processes similar to each other.

In the semiconductor integrated circuit 1, the operating frequency and power consumption of the predetermined circuit may deviate from specified ranges. At this time, an input signal to the predetermined circuit is multiplied in advance by a correction parameter in accordance with the characteristic variations of PMOS and NMOS transistors; accordingly, the influence of the characteristic variations can be reduced. It is necessary to separately estimate the characteristic variations of PMOS and NMOS transistors for each chip in order to execute the correction process. Hence, in the embodiment, the on-chip measurement circuit 100 is mounted on the same semiconductor substrate (semiconductor chip) as the predetermined circuit to obtain parameters for separately estimating the characteristic variations of the PMOS and NMOS transistors.

Figure 1:
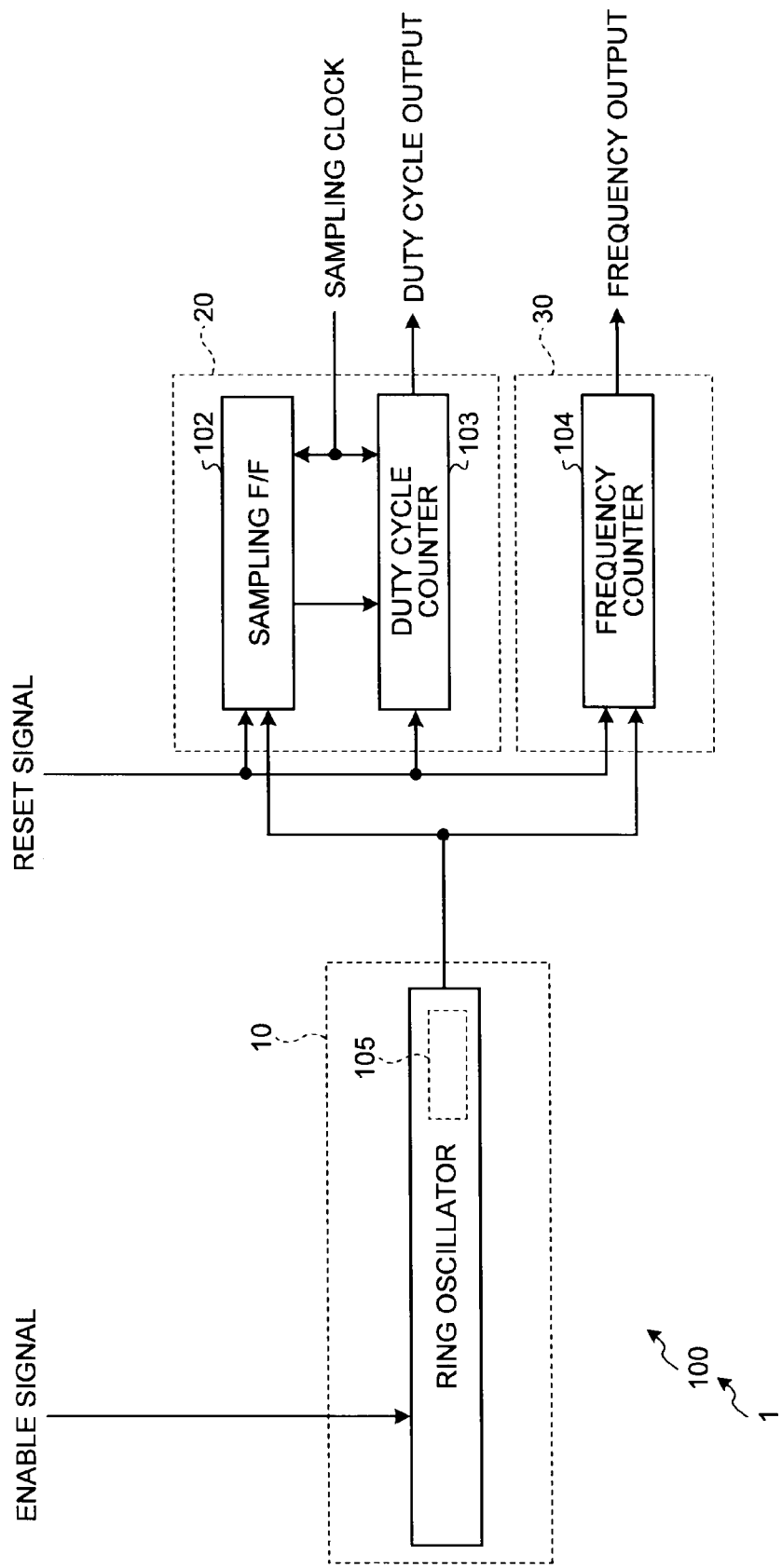
FIG. 1 is a view illustrating the configuration of an on-chip measurement circuit in a first embodiment.

Next, a description will be given of the configuration of the on-chip measurement circuit 100 with reference to FIG. 1. FIG. 1 is a view illustrating the configuration of the on-chip measurement circuit 100.

The measurement circuit 100 includes a unit to be measured 10, a first measurement unit 20, and a second measurement unit 30.

The unit to be measured 10 is a measurement target for obtaining parameters for separately estimating the characteristic variations of the PMOS and NMOS transistors. The unit to be measured 10 includes a ring oscillator 101 and a buffer line 105. Specifically, the ring oscillator 101 includes a buffer line 105 therein. If an enable signal stays at an active level for a predetermined time or longer, the ring oscillator 101 generates a periodic pulse in a first cycle, delays the generated periodic pulse at the buffer line 105, and outputs the delayed periodic pulse. The delayed periodic pulse has a waveform with a frequency and a duty cycle, which are dependent on a source-drain current $I_{drP}$ of the PMOS transistor and a source-drain current $I_{drN}$ of the NMOS transistor. If the enable signal is changed to a non-active level, the ring oscillator 101 stops the operation of generating periodic pulses.

The first measurement unit 20 measures the duty cycle of the waveform of the periodic pulse output from the unit to be measured 10. Specifically, the first measurement unit 20 includes a sampling flip-flop 102 and a duty cycle counter 103. The sampling flip-flop 102 and the duty cycle counter 103 operate in synchronization with sampling clocks received from the outside (for example, a clock generation unit 142 shown in FIG. 9). The sampling clock is a periodic pulse having a second cycle that is asynchronous to the first cycle. As long as being asynchronous to the cycle of the periodic pulse output from the unit to be measured 10, the cycle of the sampling clock may be longer than the cycle of the periodic pulse output from the unit to be measured 10 or may be shorter than the cycle of the periodic pulse output from the unit to be measured 10.

The sampling flip-flop 102 maintains the level of the periodic pulse output from the unit to be measured 10 in synchronization with the sampling clock. The duty cycle counter 103 counts the number of times that the level maintained by the sampling flip-flop 102 is an H level (the number of H levels) in synchronization with the sampling clock. The duty cycle counter 103 outputs the number of H levels to a subsequent stage (for example, an estimation unit 144 shown in FIG. 9) as a value indicating the duty cycle. Moreover, the sampling flip-flop 102 and the duty cycle counter 103 are reset if receiving a reset signal at the active level from the outside (for example, a controller 143 shown in FIG. 9), and the reset is cancelled if the sampling flip-flop 102 and the duty cycle counter 103 receive a reset signal at the non-active level.

The second measurement unit 30 measures the frequency of the periodic pulse output from the unit to be measured 10. Specifically, the second measurement unit 30 includes a frequency counter 104. The frequency counter 104 is reset if receiving a reset signal from the outside (for example, the controller 143 shown in FIG. 9), and the reset is cancelled if the frequency counter 104 receives a reset signal at the non-active level. The frequency counter 104 counts the number of pulses of the periodic pulse output from the unit to be measured 10, for a fixed time within a period from the timing of the reset cancellation to the timing of the next reset. The frequency counter 104 outputs the number of pulses to the subsequent stage (for example, the estimation unit 144 shown in FIG. 9) as a value indicating the frequency.

Figure 2:
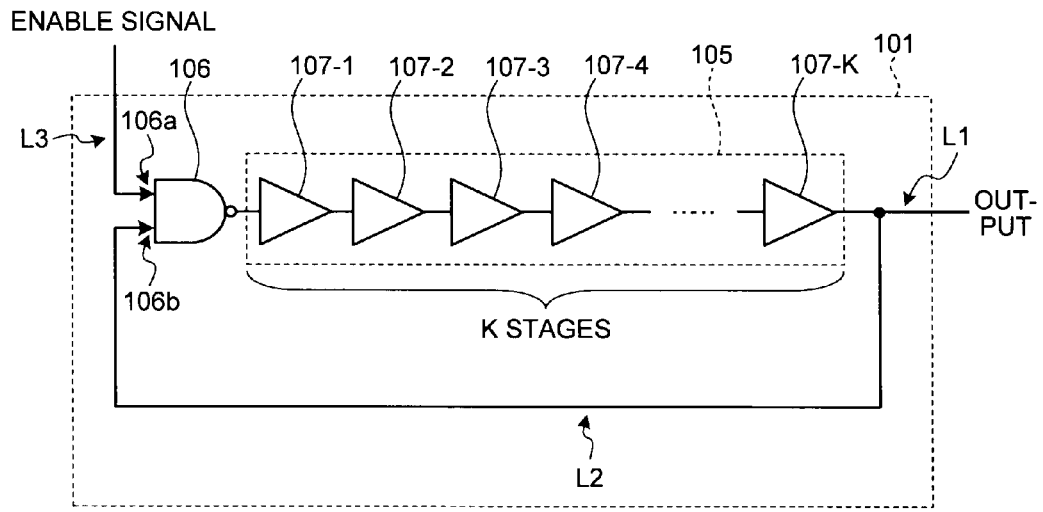
FIG. 2 is a view illustrating the configuration of a ring oscillator in the first embodiment.

Next, a detailed description will be given of the ring oscillator 101. FIG. 2 is a view illustrating the internal configuration of the ring oscillator 101.

The ring oscillator 101 includes a NAND circuit 106 and the buffer line 105, for example. A plurality of delay buffers (a plurality of delay elements) 107-1 to 107-K is connected in series in the buffer line 105. An input terminal 106a of the NAND circuit 106 is supplied with an enable signal via a line L3, and an input terminal 106b thereof is connected to an output terminal of the delay buffer 107-K at the final stage in the buffer line 105 via a line L2. An output terminal of the NAND circuit 106 is connected to an input terminal of the buffer line 105. An output terminal of (the delay buffer 107-K at the final stage in) the buffer line 105 is connected to the first measurement unit 20 and the second measurement unit 30 (see FIG. 1) via a line L1, and is connected to the input terminal of the NAND circuit 106 via the line L2. The NAND circuit 106 and the plurality of delay buffers 107-1 to 107-K are connected in a ring shape.

The NAND circuit 106 is a control gate of the ring oscillator 101, and inverts the output of the ring oscillator 101 to feed back an enable signal to the first of the ring oscillator when the enable signal is at the H level, and accordingly causes oscillation, and stops oscillation when the enable signal is at the L level. The plurality of delay buffers 107-1 to 107-K is connected to the subsequent stage of the NAND circuit 106.

Figure 3:
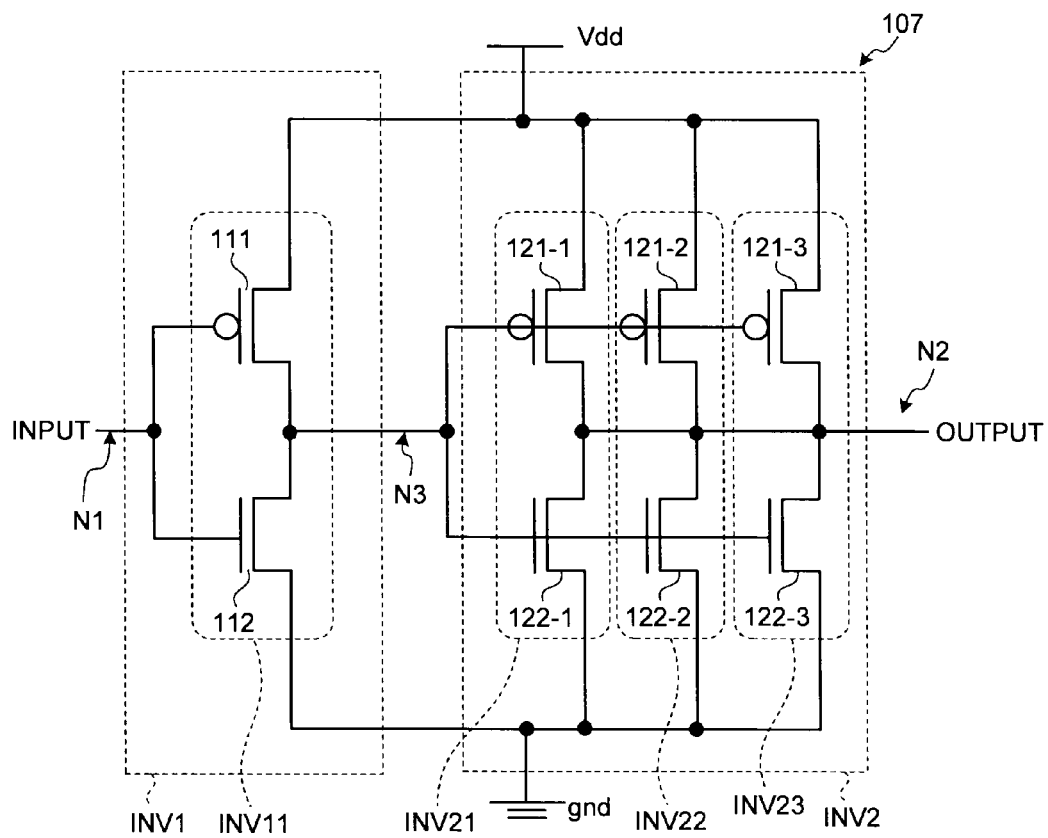
FIG. 3 is a view illustrating the configuration of a delay element in the first embodiment.

In each delay buffer 107, two inverter units INV1 and INV2 are connected in series between an input node N1 and an output node N2 via a connection node N3 as shown in FIG. 3, for example. Each of the inverter units INV1 and INV2 includes a PMOS transistor and an NMOS transistor. In this configuration, the values of the delay amounts of the former-stage inverter unit INV1 and the latter-stage inverter unit INV2 are set to be different; accordingly, it is possible to make rising and falling delays by the delay buffer 107 dependent on $I_{drN}$ and $I_{drP}$, respectively.

Figure 7A:
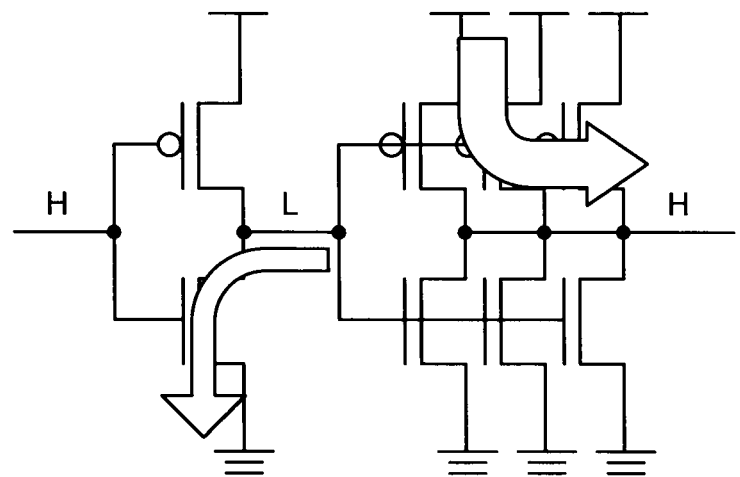
FIGS. 7A and 7B are views illustrating the principle of the duty cycle measurement in the first embodiment.

For example, if the delay amount of the former-stage inverter unit INV1 is designed to be larger than the delay amount of the latter-stage inverter unit INV2, currents flow through the NMOS transistor of the former-stage inverter unit INV1 and the PMOS transistor of the latter-stage inverter unit INV2, respectively, as shown in FIG. 7A, when the output waveform of the delay buffer 107 rises from the L level to the H level. At this time, since the delay amount of the former-stage inverter unit INV1 is designed to be larger than the delay amount of the latter-stage inverter unit INV2, the drain current of the NMOS transistor of the former-stage inverter unit INV1 is less than the drain current of the PMOS transistor of the latter-stage inverter unit INV2 as shown by outline arrows in FIG. 7A. Hence, the influence of the NMOS transistor of the former-stage inverter unit INV1 becomes dominant over a rising delay by the delay buffer 107. In other words, the rising delay by the delay buffer 107 is mainly dependent on the drain current $I_{drN}$ of the NMOS transistor.

Figure 7B:
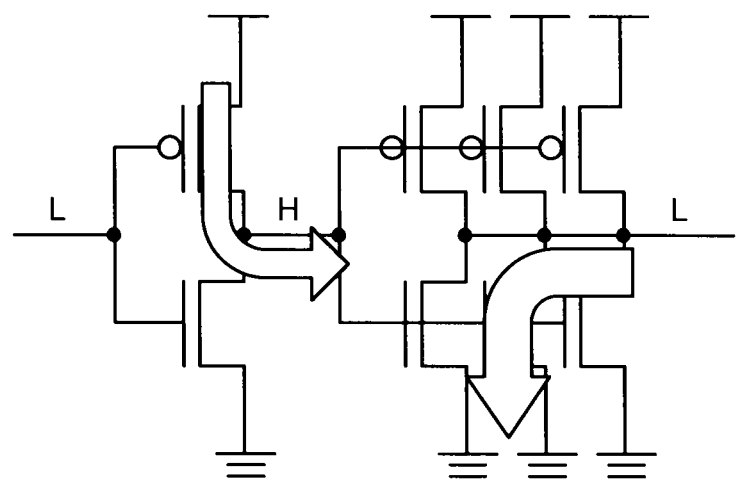

For example, if the delay amount of the former-stage inverter unit INV1 is designed to be larger than the delay amount of the latter-stage inverter unit INV2, currents flow through the PMOS transistor of the former-stage inverter unit INV1 and the NMOS transistor of the latter-stage inverter unit INV2, respectively, as shown in FIG. 7B, when the output waveform of the delay buffer 107 falls from the H level to the L level. At this time, since the delay amount of the former-stage inverter unit INV1 is designed to be larger than the delay amount of the latter-stage inverter unit INV2, the drain current of the PMOS transistor of the former-stage inverter unit INV1 is less than the drain current of the NMOS transistor of the latter-stage inverter unit INV2 as shown by outline arrows in FIG. 7B. Hence, the influence of the PMOS transistor of the former-stage inverter unit INV1 becomes dominant over a falling delay by the delay buffer 107. In other words, the falling delay by the delay buffer 107 is mainly dependent on the drain current $I_{drP}$ of the PMOS transistor.

The delay buffer 107 that makes the delay mount of the former-stage inverter unit INV1 larger than the delay mount of the latter-stage inverter unit INV2 may be configured similarly to FIG. 3, for example. The delay buffer 107 shown in FIG. 3 is one where the former-stage inverter unit INV1 has been changed in the current drive capability from the latter-stage inverter unit INV2. For example, the current drive capability of the former-stage inverter unit INV1 has been changed to be smaller than the current drive capability of the latter-stage inverter unit INV2.

The former-stage inverter unit INV1 includes one inverter INV11, for example. An input terminal of the inverter INV11 is connected to the input node N1, and an output terminal thereof is connected to the connection node N3. A PMOS transistor 111 and an NMOS transistor 112 are connected as an inverter in the inverter INV11. The latter-stage inverter unit INV2 includes three inverters INV21 to INV23, for example. The three inverters INV21 to INV23 are connected in parallel between the connection node N3 and the output node N2. An input terminal of the inverter INV21 is connected to the connection node N3, and an output terminal thereof is connected to the output node N2. A PMOS transistor 121-1 and an NMOS transistor 122-1 are connected as an inverter in the inverter INV21. An input terminal of the inverter INV22 is connected to the connection node N3, and an output terminal thereof is connected to the output node N2. A PMOS transistor 121-2 and an NMOS transistor 122-2 are connected as an inverter in the inverter INV22. An input terminal of the inverter INV23 is connected to the connection node N3, and an output terminal thereof is connected to the output node N2. A PMOS transistor 121-3 and an NMOS transistor 122-3 are connected as an inverter in the inverter INV23.

In rising propagation, after the NMOS transistor 112 charges the gates of a total of six devices of the PMOS transistors 121-1 to 121-3 and the NMOS transistors 122-1 to 122-3, three devices of the PMOS transistors 121-1 to 121-3 charge two devices of the PMOS transistor 111 and the NMOS transistor 112 of the delay buffer 107 in the next stage via the output node N2. Simply given that the delay times of the inverters INV11, INV21, INV22, and INV23 are proportional to gate capacitance and are inversely proportional to current, a delay at the former stage is nine times longer than that at the latter stage, and a rising delay time is largely dependent on the value of the current through the NMOS transistor 112. Similarly, a falling delay time is largely dependent on the current through the PMOS transistor 111.

Mathematical expressions will be used for explanations. Assume that a rising delay time of one device of the delay buffers 107 is $t_{rise}$, and a falling delay time thereof is $t_{fall}$. Since $t_{rise}$ and $t_{fall}$ are largely dependent on $I_{drN}$ and $I_{drP}$, respectively, it is necessary that $t_{rise}$ and $t_{fall}$ can be measured in order to obtain $I_{drN}$ and $I_{drP}$. Assuming that the number of delay buffers of the ring oscillator 101 in FIG. 2 is denoted by K, the output cycle of the ring oscillator 101 is $K(t_{rise}+t_{fall})$, and the duty cycle is $t_{fall}/(t_{rise}+t_{fall})$. However, for simplification, it is assumed that there is no delay by the NAND circuit 106. Hence, it is made possible to measure a rising delay time and a falling delay time by measuring the frequency and the duty cycle of the output of the ring oscillator 101.

Next, a description will be given of the operation of the sampling flip-flop 102 and the duty cycle counter 103, which are mechanisms for measuring the duty cycle of the output of the ring oscillator by a digital circuit alone with reference to FIG. 4.

Figure 4:
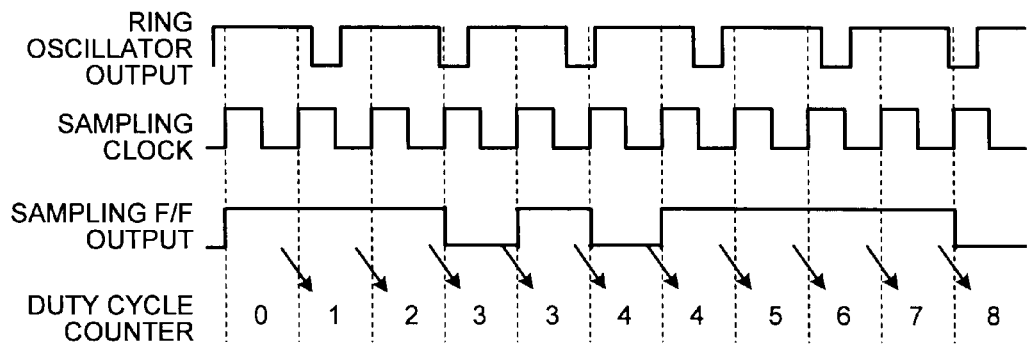
FIG. 4 is a view illustrating the operation of a duty cycle counter in the first embodiment.

The topmost row of FIG. 4 shows an output waveform of the ring oscillator 101, which is a rectangular wave (periodic pulse) having a certain cycle and duty cycle. The sampling flip-flop 102 samples the output waveform of the ring oscillator 101 at the rising timing of a sampling clock.

The second row from the top in FIG. 4 shows the waveform of a sampling clock. The third row from the top in FIG. 4 shows a sampling result by the sampling flip-flop 102.

As shown in the bottom row of FIG. 4, the duty cycle counter 103 is a counter (H level counter) that counts up at the rising edge of a sampling clock if the result of the output of the sampling flip-flop 102 is at the H level, and maintains the value if at the L level. Such operations are performed for a fixed time or longer, and the number of inputted sampling clocks is compared with the value of the duty cycle counter (the number of H levels); accordingly, it is possible to obtain the duty cycle of the output waveform of the ring oscillator 101.

To accurately measure the duty cycle, it is necessary that the cycle of the output (periodic pulse) of the ring oscillator 101 and the cycle of a sampling clock (periodic pulse) are asynchronous, and a period of level transition is adequately short.

If two waveforms are synchronous and the cycle can be expressed by a simple integer ratio, the duty cycle has only a resolution of the extent of the inverse of the integer. As a measure against this, it is conceivable, for example, that the system clock of the semiconductor integrated circuit 1 is used for a sampling clock, or an oscillator for generating sampling clocks is mounted separately from the ring oscillator 101. For example, the clock generation unit 142 shown in FIG. 9 may be a circuit that generates system clocks, or may be an oscillator for generating sampling clocks.

Otherwise, if a period of level transition of a waveform is long, the rising edge of a sampling clock comes while the level of the output of the ring oscillator 101 is changing, and a metastable state occurs, and therefore it becomes impossible to measure accurately, either. In terms of a measure against this, the transition period is made short by passing two waveforms through the delay buffer respectively before inputting the two waveforms to the sampling flip-flop 102. Moreover, if a metastable state occurs, when the duration of the metastable state becomes substantially equal to the cycle of a sampling clock, the duty cycle counter may malfunction. To handle this, the sampling flip-flop 102 is configured of two stages.

Next, a description will be given of operations related to frequency measurement. In terms of the frequency measurement, the frequency counter 104 counts the frequency of the output waveform (periodic pulse) of the ring oscillator 101. The frequency counter 104 should count the number of rising edges of the output (periodic pulse) of the ring oscillator 101 over a fixed time T.

Figure 5:
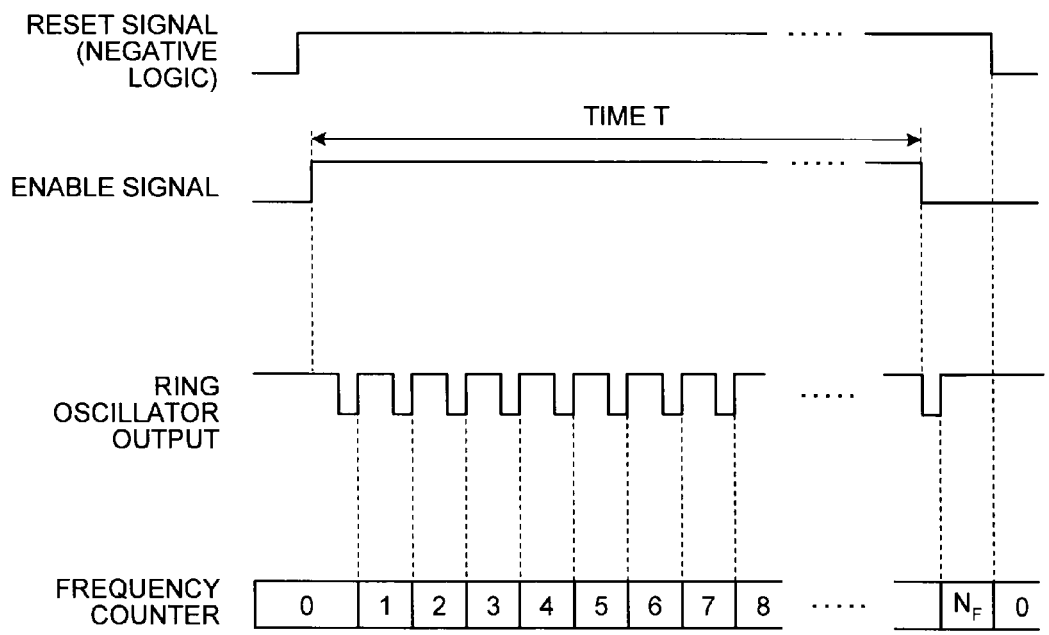
FIG. 5 is a view illustrating operations related to frequency measurement in the first embodiment.

A series of operations at the time of measurement are shown in FIGS. 5 and 6. When measurement is started, a reset signal is firstly cancelled, and then an enable signal is set to the H level only for the fixed time T to oscillate the ring oscillator. A reset signal is usually implemented by a negative logic, and is shown in that way in FIG. 5, too. If an enable signal is set to H, the ring oscillator 101 starts oscillating, and the frequency counter 104 starts counting the number of rising edges of the output (periodic pulse) of the ring oscillator 101. Furthermore, if a sampling clock is inputted, the duty cycle counter 103, too, performs the count-up operation in accordance with the duty cycle of the output (periodic pulse) of the ring oscillator 101 as shown in FIG. 6. Assume that a total of sampling clocks are $N_S$. When the measurement time T ends and an enable signal is set to L as well as a sampling clock is stopped, the ring oscillator 101, too, stops oscillating for a short time. After a count value $N_D$ of the duty cycle counter 103 and a count value $N_F$ of the frequency counter 104 at this time are read, a reset signal is set to L, and the values of the duty cycle counter 103, the frequency counter 104, and the sampling flip-flop 102 are reset.

A frequency F and a duty cycle D are obtained from the measurement time T, the number of sampling clocks, $N_S$, the duty cycle counter value $N_D$, and the frequency counter value $N_F$ as in the following mathematical expressions 1 and 2.

$F=N_F/T$            Mathematical Expression 1

$D=N_D/N_S$            Mathematical Expression 2

Figure 8A:
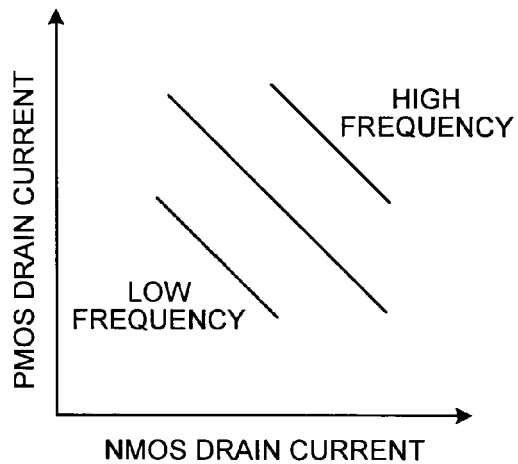
FIGS. 8A, 8B and 8C are views illustrating the effects by the first embodiment.
Figure 8B:
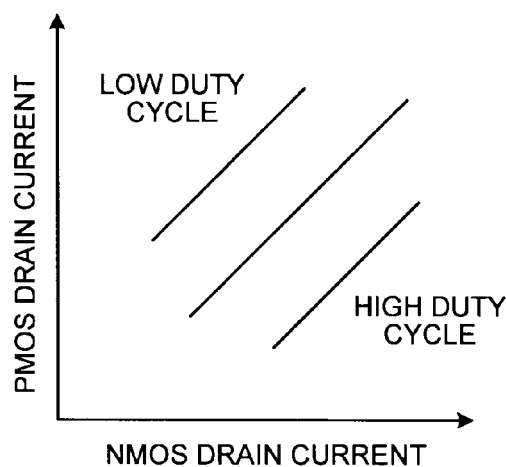

Lastly, it is necessary to obtain the current $I_{drP}$ of the PMOS transistor and the current $I_{drN}$ of the NMOS transistor from the frequency F and the duty cycle D. These relationships qualitatively become those shown in FIGS. 8A to 8C. FIG. 8A shows the frequency contour lines of the drain current of the NMOS transistor and the drain current of the PMOS transistor, and the frequency tends to be high if a total value of the drain current of the NMOS transistor and the drain current of the PMOS transistor is large, and the frequency tends to be low if the total value is small. FIG. 8B shows the duty cycle contour lines of the drain current of the NMOS transistor and the drain current of the PMOS transistor, and the duty cycle tends to be high if a difference value (which means including a code) obtained by subtracting the drain current of the PMOS transistor from the drain current of the NMOS transistor is large, and the duty cycle tends to be low if the difference value is small.

Figure 8C:
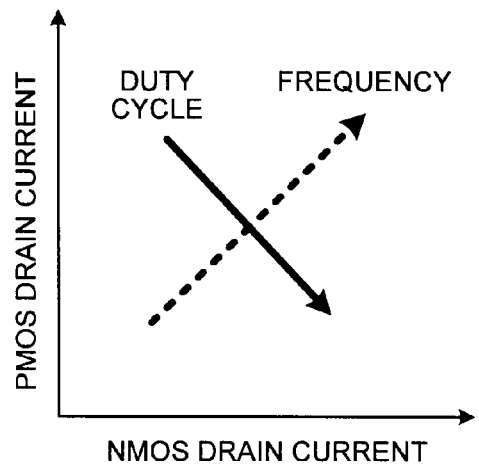

In this manner, the use of two parameters of the frequency and the duty cycle makes it possible to estimate the drain current of the NMOS transistor and the drain current of the PMOS transistor independently of each other as shown in FIG. 8C. In terms of a detailed method for obtaining values, the relationship between these current values, the frequency and the duty cycle is determined, complicatedly intertwined with various factors; accordingly, rather than converting some model into numbers, it is preferable to take data on the frequency, the duty cycle and the currents of numerous sample chips of the semiconductor integrated circuit 1, and perform fitting based on the data to calculate values.

As described above, in the on-chip measurement circuit 100 in the first embodiment, the unit to be measured 10 generates a periodic pulse, causes the buffer line where a plurality of delay buffers where the delay amount of the former-stage inverter unit is different from the delay amount of the latter-stage inverter unit is connected in series to delay the periodic pulse, and outputs the periodic pulse. Additionally, the first measurement unit 20 measures the duty cycle of the periodic pulse output from the unit to be measured 10, and the second measurement unit 30 measures the frequency of the periodic pulse output from the unit to be measured 10. Accordingly, it is possible to obtain the duty cycle and the frequency of the periodic pulse as parameters for separately estimating the characteristic variations of the PMOS and NMOS transistors.

Moreover, analog operations are not necessary in the configuration of the first embodiment; accordingly, it is possible to configure the on-chip measurement unit 100 with digital circuits alone.

Moreover, in the unit to be measured 10 in the first embodiment, the ring oscillator 101 includes the buffer line 105 therein. Accordingly, it is possible to configure circuits for oscillation and delay as the ring oscillator 101 and expect space saving.

Figure 9:
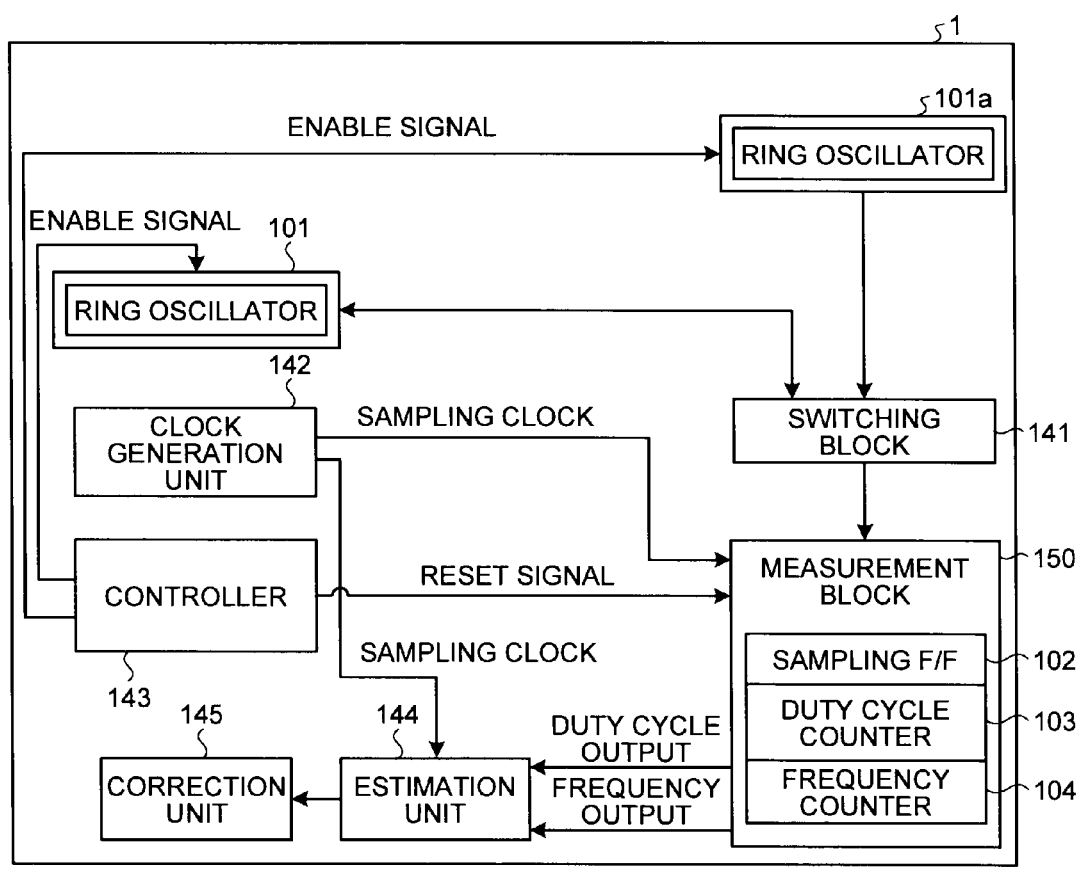
FIG. 9 is a view illustrating a mode of implementing the on-chip measurement circuit on a semiconductor integrated circuit in the first embodiment.

Moreover, in the first embodiment, the number of output signals of the ring oscillator 101 itself is one, and therefore it is possible to expect further space saving with the LSI configuration shown in FIG. 9.

FIG. 9 is a view illustrating a mode of implementing the measurement circuit 100 according to the first embodiment on the semiconductor integrated circuit 1 (as a one-chip LSI). The current values may vary also by location on the chip; accordingly, a plurality of ring oscillators 101 and 101a is mounted to monitor currents at the respective locations. In this case, it is necessary for the ring oscillators 101 and 101a to be mounted in the respective locations; however, a measurement block 150 including the sampling flip-flop 102, the duty cycle counter 103, and the frequency counter 104 can be shared. At this time, a switching block 141 is disposed between the plurality of ring oscillators 101 and 101a and the measurement block 150, and the plurality of ring oscillators 101 and 101a are sequentially connected by the switching block 141 to the measurement block 150 to measure. At this time, it is necessary to connect between each of the ring oscillators 101 and 101a and the measurement block 150 with a signal line. Given that there is a plurality of output signals of each of the ring oscillators 101 and 101a, a plurality of signal lines is placed for the long distance between the ring oscillators 101 and 101a, and the measurement block 150; signals transmitted on these signal lines may be deteriorated due to crosstalk. However, if the number of outputs of each of the ring oscillators 101 and 101a is one as in the first embodiment, it is an advantage to have no such a possibility.

Moreover, as shown in FIG. 9, the clock generation unit 142 configured to supply sampling clocks, the controller 143 configured to supply enable signals and reset signals, and the like may be disposed around the measurement block 150. Moreover, the estimation unit 144 configured to receive the measurement results of the duty cycle and the frequency output from the measurement block 150 may be further disposed around the measurement block 150. The estimation unit 144 receives sampling clocks from the clock generation unit 142 and counts the number of clocks as well as uses the measurement results of the duty cycle and the frequency to obtain the duty cycle D and the frequency F, for example from the mathematical expressions 2 and 1, and accordingly performs the processes shown in FIGS. 8A to 8C to estimate the drain current of the NMOS transistor and the drain current of the PMOS transistor independently of each other. A correction unit 145 configured to receive the estimation results by the estimation unit 144 may be further disposed around the estimation unit 144. The correction unit 145 uses the estimation results by the estimation unit 144 to obtain a correction parameter in accordance with the characteristic variations of the PMOS and NMOS transistors. The correction unit 145 then multiplies an input signal to a predetermined circuit by the correction parameter. Accordingly, the influence of the characteristic variations of the PMOS and NMOS transistors in the operation of the predetermined circuit can be reduced.

Figure 10:
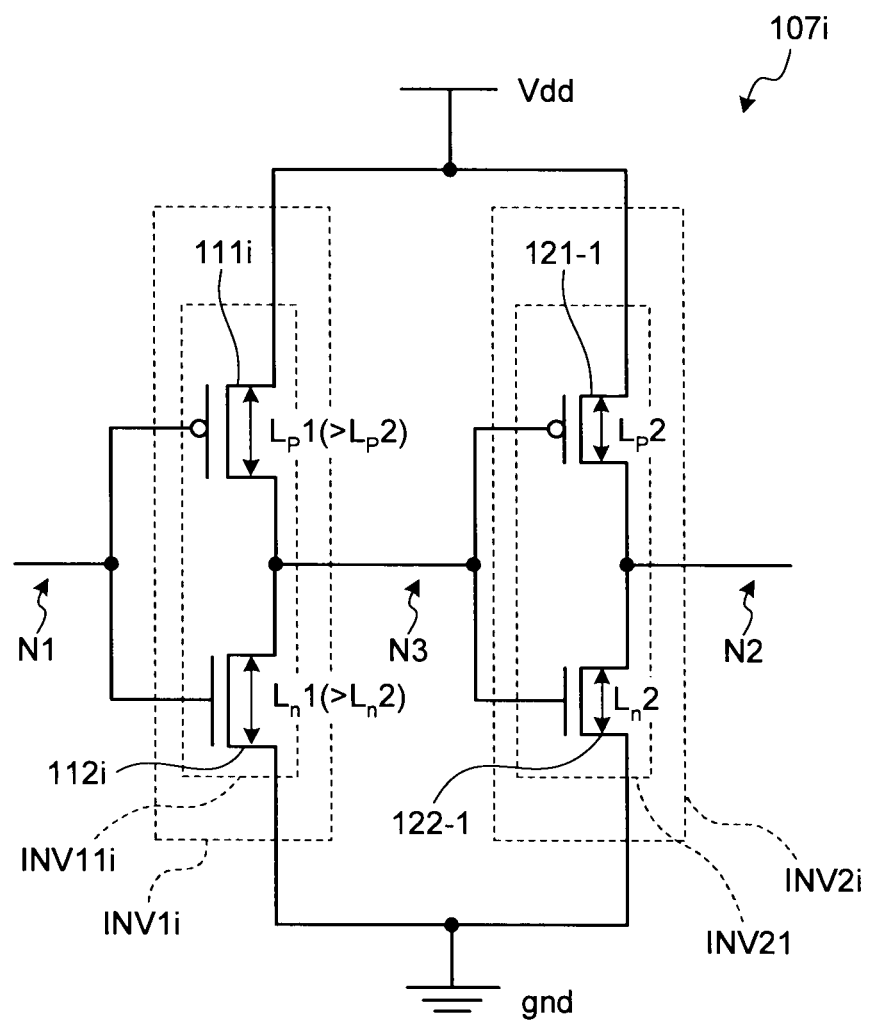
FIG. 10 is a view illustrating the configuration of a delay element in a modification of the first embodiment.

A delay buffer 107i that makes the delay amount of a former-stage inverter unit INV1i larger than the delay amount of a latter-stage inverter unit INV2i may be configured as shown in FIG. 10, for example. In the delay buffer 107i shown in FIG. 10, for example, the number of inverters of the former-stage inverter unit INV1i is made equal to the number of inverters of the latter-stage inverter unit INV2i, and the gate lengths of the former-stage inverter unit INV1i are made longer than the gate lengths of the latter-stage inverter unit INV2i; accordingly, it is possible to make the delay amount of the former-stage inverter unit INV1i larger than the delay amount of the latter-stage inverter unit INV2i. In other words, a gate length Lp1 of a PMOS transistor 111i of an inverter INV11i of the former-stage inverter unit INV1i is longer than a gate length Lp2 of a PMOS transistor 121-1 of an inverter INV21 of the latter-stage inverter unit INV2i. A gate length Ln1 of an NMOS transistor 112i of the inverter INV11i of the former-stage inverter unit INV1i is longer than a gate length Ln2 of an NMOS transistor 122-1 of the inverter INV21 of the latter-stage inverter unit INV2i.

Figure 11:
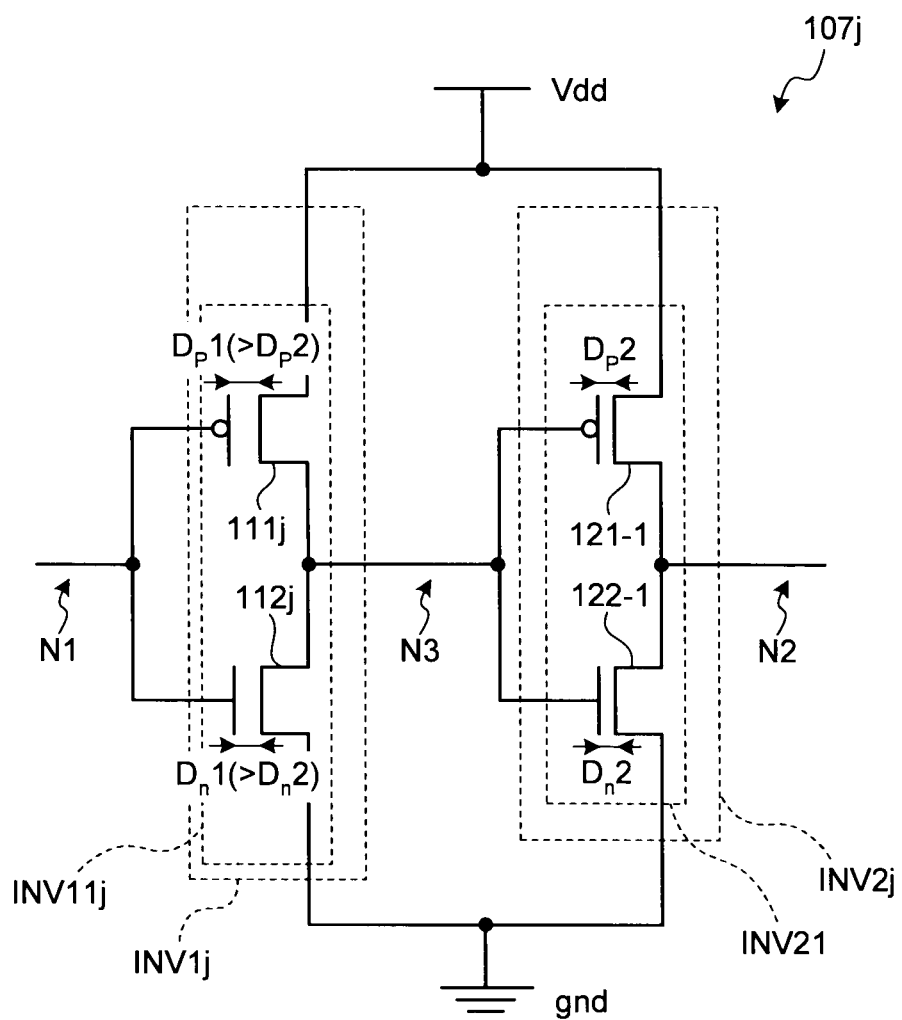
FIG. 11 is a view illustrating the configuration of a delay element in a modification of the first embodiment.

Otherwise, a delay buffer 107j that makes the delay amount of a former-stage inverter INV1j larger than the delay amount of a latter-stage inverter unit INV2j may be configured as shown in FIG. 11, for example. In the delay buffer 107j shown in FIG. 11, for example, the number of inverters of the former-stage inverter unit INV1j is made equal to the number of inverters of the latter-stage inverter unit INV2j, and the gate insulating film thicknesses of the former-stage inverter unit INV1j are made thicker than the gate insulating film thicknesses of the latter-stage inverter unit INV2j; accordingly, it is possible to make the delay amount of the former-stage inverter unit INV1j larger than the delay amount of the latter-stage inverter unit INV2j. In other words, a gate insulating film thickness Dp1 of a PMOS transistor 111j of an inverter INV11j of the former-stage inverter unit INV1j is thicker than a gate insulating film thickness Dp2 of a PMOS transistor 121-1 of an inverter INV21 of the latter-stage inverter unit INV2j. A gate insulating film thickness Dn1 of an NMOS transistor 112j of the inverter INV11j of the former-stage inverter unit INV1j is thicker than a gate insulating film thickness Dn2 of an NMOS transistor 122-1 of the inverter INV21 of the latter-stage inverter unit INV2j.

Figure 12:
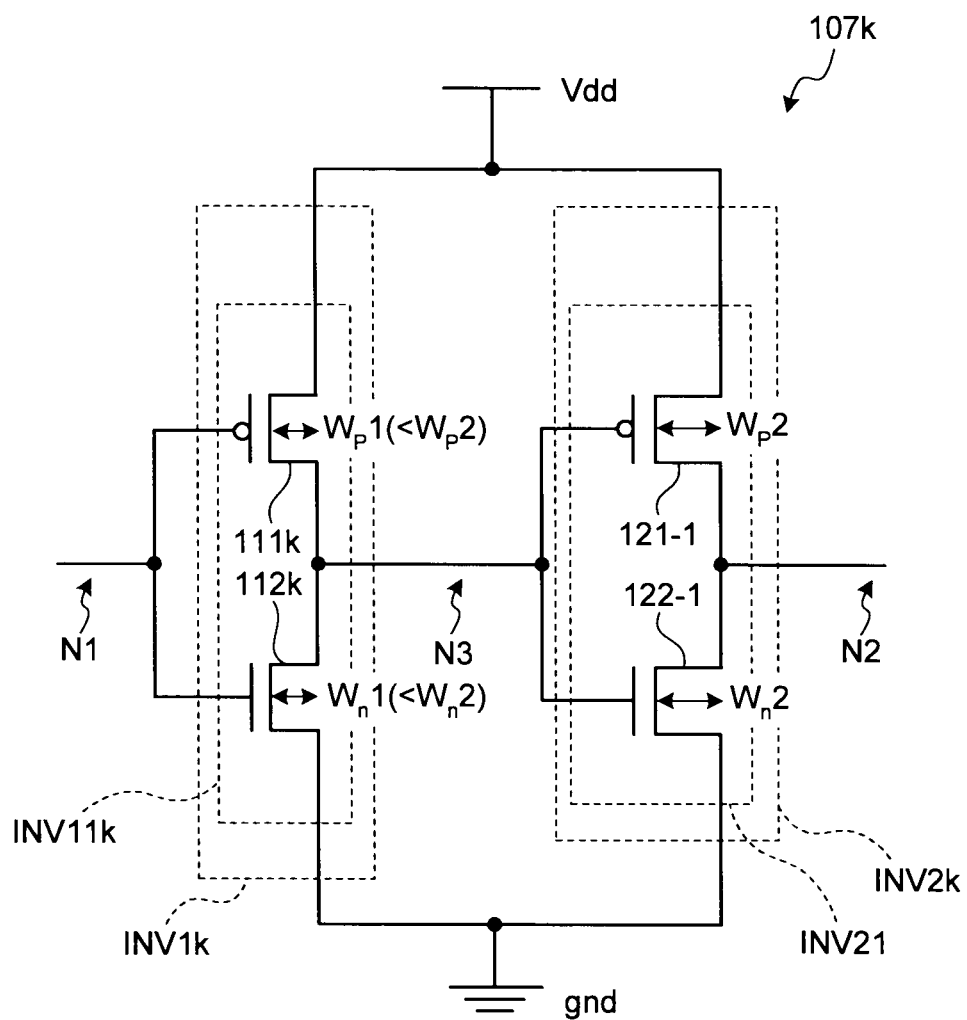
FIG. 12 is a view illustrating the configuration of a delay element in a modification of the first embodiment.

Otherwise, a delay buffer 107k that makes the delay amount of a former-stage inverter unit INV1k larger than the delay amount of a latter-stage inverter unit INV2k may be configured as shown in FIG. 12, for example. In the delay buffer 107k shown in FIG. 12, for example, the number of inverters of the former-stage inverter unit INV1k is made equal to the number of inverters of the latter-stage inverter unit INV2k, and the gate widths of the former-stage inverter unit INV1k are made narrower than the gate widths of the latter-stage inverter unit INV2k; accordingly, it is possible to make the delay amount of the former-stage inverter unit INV1k larger than the delay amount of the latter-stage inverter unit INV2k. In other words, a gate width Wp1 of a PMOS transistor 111k of an inverter INV11k of the former-stage inverter unit INV1k is narrower than a gate width Wp2 of a PMOS transistor 121-1 of an inverter INV21 of the latter-stage inverter unit INV2k. A gate width Wn1 of an NMOS transistor 112k of the inverter INV11k of the former-stage inverter unit INV1k is narrower than a gate width Wn2 of an NMOS transistor 122-1 of the inverter INV21 of the latter-stage inverter unit INV2k.

Figure 13:
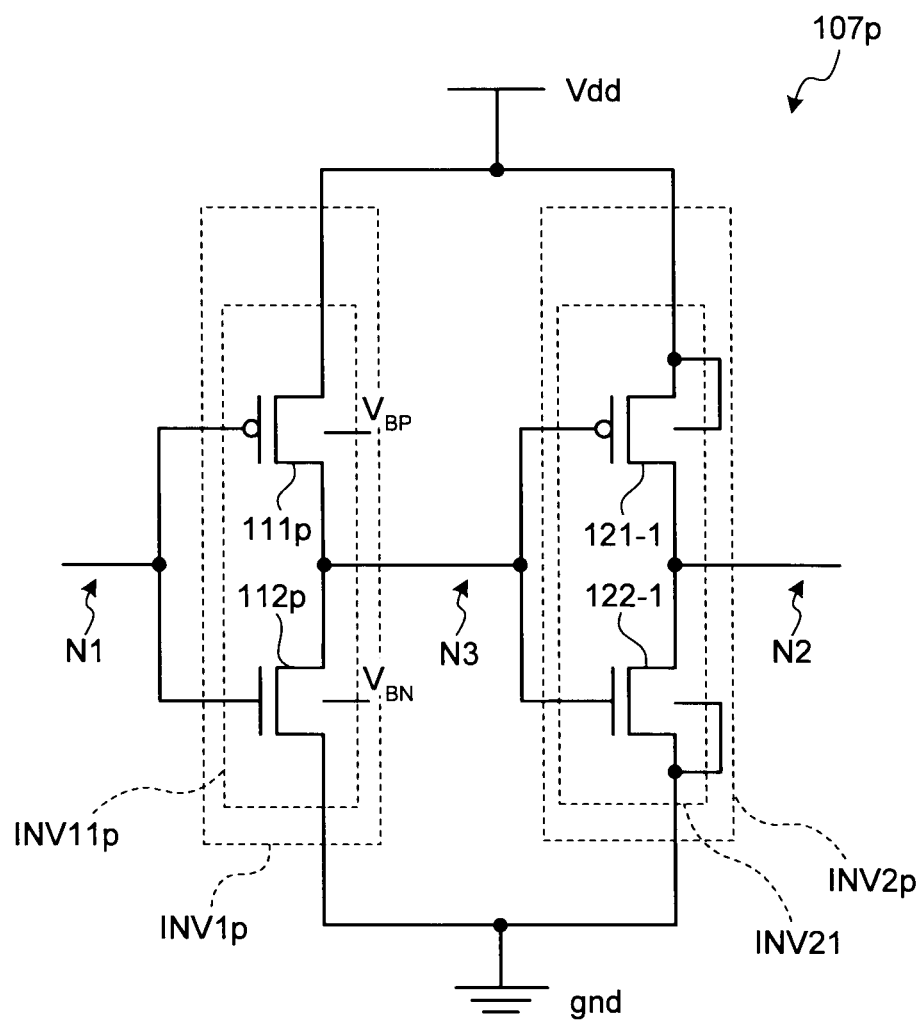
FIG. 13 is a view illustrating the configuration of a delay element in a modification of the first embodiment.

Otherwise, a delay buffer 107p that makes the delay amount of a former-stage inverter INV1p larger than the delay amount of a latter-stage inverter unit INV2p may be configured as shown in FIG. 13, for example. In the delay buffer 107p shown in FIG. 13, for example, the number of inverters of the former-stage inverter unit INV1p is made equal to the number of inverters of the latter-stage inverter unit INV2p, and the back gate biases of the former-stage inverter unit INV1p are selectively reverse-biased; accordingly, it is possible to make the delay amount of the former-stage inverter unit INV1p larger than the delay amount of the latter-stage inverter unit INV2p. In other words, a back gate bias $V_{BP}$ of a PMOS transistor 111p of an inverter INV11p of the former-stage inverter unit INV1p is reverse-biased, but a back gate bias of a PMOS transistor 121-1 of an inverter INV21 of the latter-stage inverter unit INV2p, in contrast, is forward-biased. A back gate bias $V_{BN}$ of an NMOS transistor 112p of the inverter INV11p of the former-stage inverter unit INV1p is reverse-biased, but a back gate bias of an NMOS transistor 122-1 of the inverter INV21 of the latter-stage inverter unit INV2p, in contrast, is forward-biased.

Figure 14:
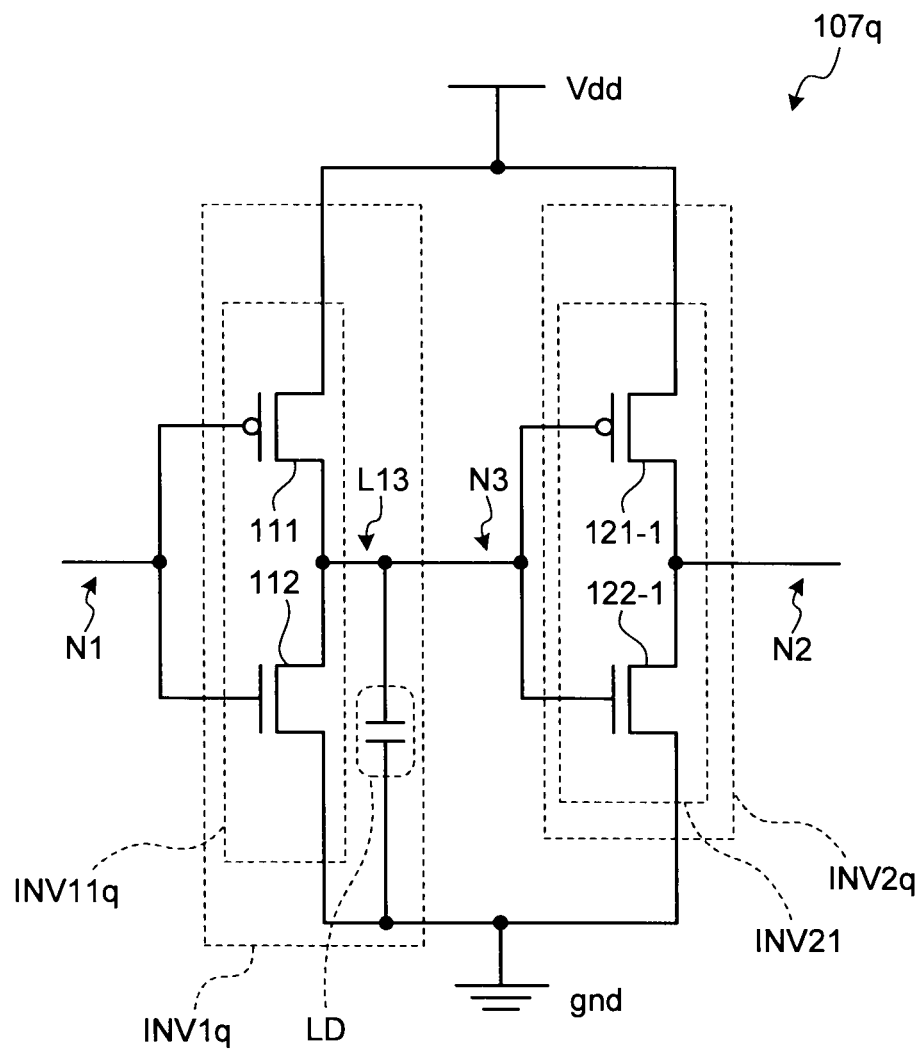
FIG. 14 is a view illustrating the configuration of a delay element in a modification of the first embodiment.

Otherwise, a delay buffer 107q that makes the delay amount of a former-stage inverter INV1q larger than the delay amount of a latter-stage inverter unit INV2q may be configured as shown in FIG. 14, for example. In the delay buffer 107q shown in FIG. 14, for example, the number of inverters of the former-stage inverter unit INV1q is made equal to the number of inverters of the latter-stage inverter unit INV2q, and a load device is selectively added to an output side of the former-stage inverter unit INV1p; accordingly, it is possible to make the delay amount of the former-stage inverter unit INV1q larger than the delay amount of the latter-stage inverter unit INV2q. In other words, for example, a capacitive element is connected, as a load device LD, between a line L13 between an output terminal of an inverter INV11 of the former-stage inverter unit INV1q and the connection node N3, and a ground potential gnd.

Moreover, in each delay buffer included in the buffer line, the delay amount of the former-stage inverter unit may be smaller than the delay mount of the latter-stage inverter unit. For example, in FIGS. 3 and 10 to 13, the configuration of the former-stage inverter unit is interchanged with the configuration of the latter-stage inverter unit; accordingly, the delay amount of the former-stage inverter unit can be configured to be smaller than the delay amount of the latter-stage inverter unit.

Second Embodiment

Next, a description will be given of a semiconductor integrated circuit according to a second embodiment. A description will hereinafter be given, focusing on parts that are different from the first embodiment.

Figure 15:
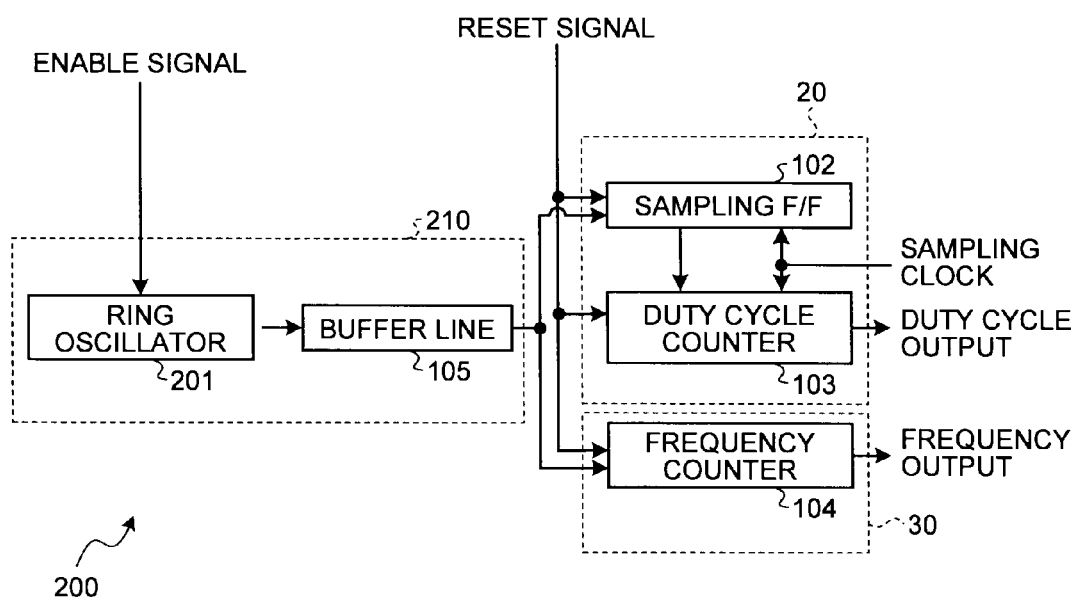
FIG. 15 is a view illustrating the configuration of an on-chip measurement circuit in a second embodiment.

In the first embodiment, the buffer line 105 is included in the ring oscillator 101 in the unit to be measured 10; however, in the second embodiment, the buffer line 105 is disposed outside the ring oscillator 101 to measure a duty cycle more accurately. Specifically, for example as shown in FIG. 15, an output terminal of a ring oscillator 201 is connected to the buffer line 105 in a unit to be measured 210 in a measurement unit 200. In other words, the buffer line 105 is electrically connected between the ring oscillator 201, and the first measurement unit 20 and the second measurement unit 30.

Comparing this configuration with the first embodiment, once the output of the ring oscillator 201 passes through the buffer line 105, the duty cycle and the frequency are measured. Similarly to the buffer line 105 in the ring oscillator 101 in the first embodiment, this buffer line 105 is constructed such that delay buffers where the delay amount of a former-stage inverter unit is different from the delay amount of a latter-stage inverter unit are arranged in a plurality of stages, and can emphasize the duty cycle.

A description will hereinafter be given with mathematical expressions. The number of stages of delay buffers in the ring oscillator 201 is denoted by $K_R$, and the number of stages of delay buffers in the buffer line 105 is denoted by $K_L$. In the configuration of the second embodiment, it is assumed that the delay buffer in the ring oscillator 201 is one where a former-stage inverter unit has been changed in the delay amount from a latter-stage inverter unit, similarly to the one in the first embodiment.

Figure 16:
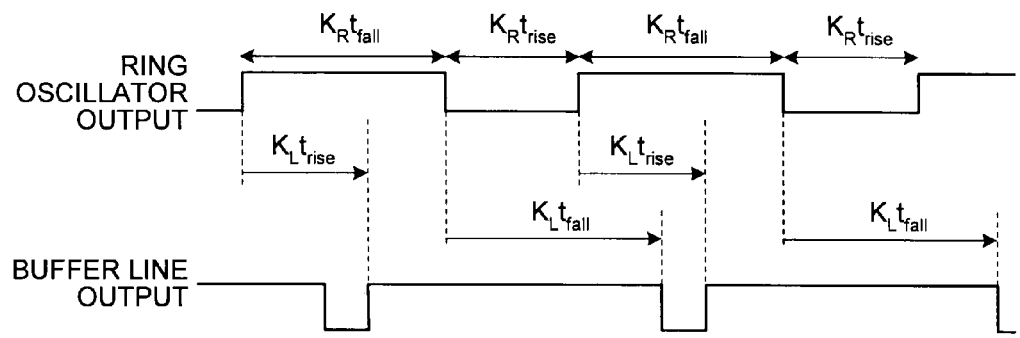
FIG. 16 is a view illustrating the operation of a buffer line in the second embodiment.

At this time, the waveform of the output (periodic pulse) of the ring oscillator 201 is a rectangular wave that repeats the L level for a time $K_R t_{rise}$ and the H level for a time $K_R t_{fall}$ as shown in the upper row of FIG. 16. If passing through the buffer line 105, this waveform becomes a waveform whose rising edge is delayed for $K_L t_{rise}$, and whose falling edge is delayed for $K_L t_{fall}$ as shown in the lower row of FIG. 16. As a result, assuming that a deviation from 50% in the duty cycle of the output of the ring oscillator 201 is denoted by $D'_R$, a deviation $D'_L$ from 50% in the duty cycle of the output (periodic pulse) of the buffer line 105 is obtained as in the following mathematical expression 3.

$$D'_L = (2 \times K_L/K_R + 1) \times D'_R \quad \text{Mathematical Expression 3}$$

However, the deviation $D'_R$ from 50% in the duty cycle of the output of the ring oscillator 201 satisfies a mathematical expression 4.

$$D'_R = t_{fall}/(t_{rise} + t_{fall}) - \tfrac{1}{2} \quad \text{Mathematical expression 4}$$

This indicates that the deviation from 50% in the duty cycle is amplified $(2 \times K_L/K_R + 1)$ times by the buffer line 105.

As described above, in the second embodiment, the output terminal of the ring oscillator 201 is connected to the buffer line 105, and the periodic pulse output from the ring oscillator 201 is delayed by the buffer line 105. Accordingly, it is possible to amplify the duty cycle of the periodic pulse and improve the measurement accuracy of the duty cycle of the periodic pulse. Accordingly, it is possible to estimate the difference between the currents of the PMOS and NMOS transistors with higher accuracy.

Figure 17A:
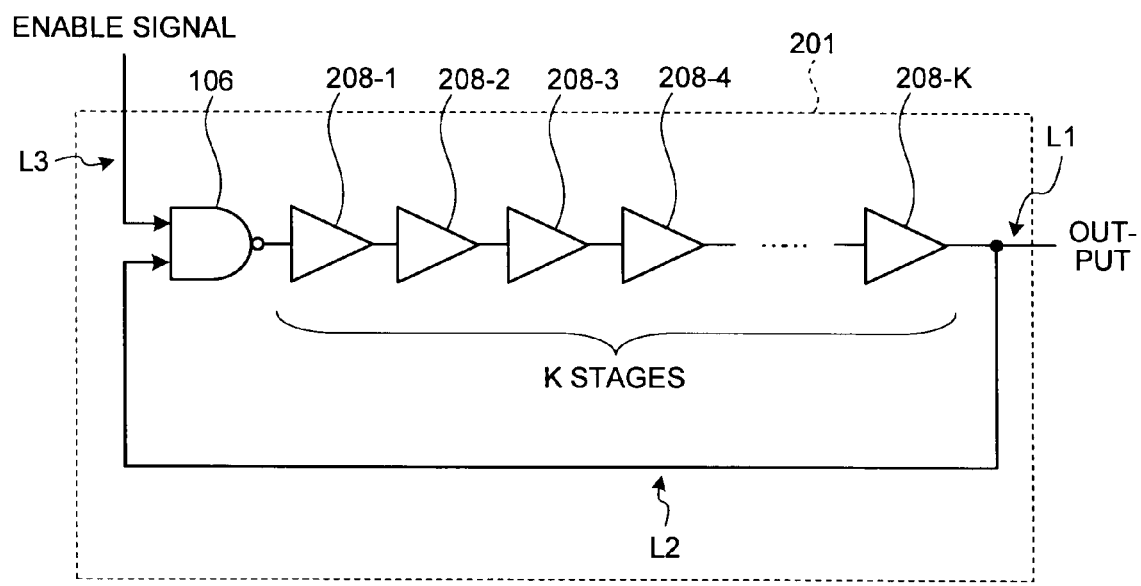
FIGS. 17A and 17B are views illustrating the configurations of a ring oscillator and a delay element in a modification of the second embodiment.
Figure 17B:
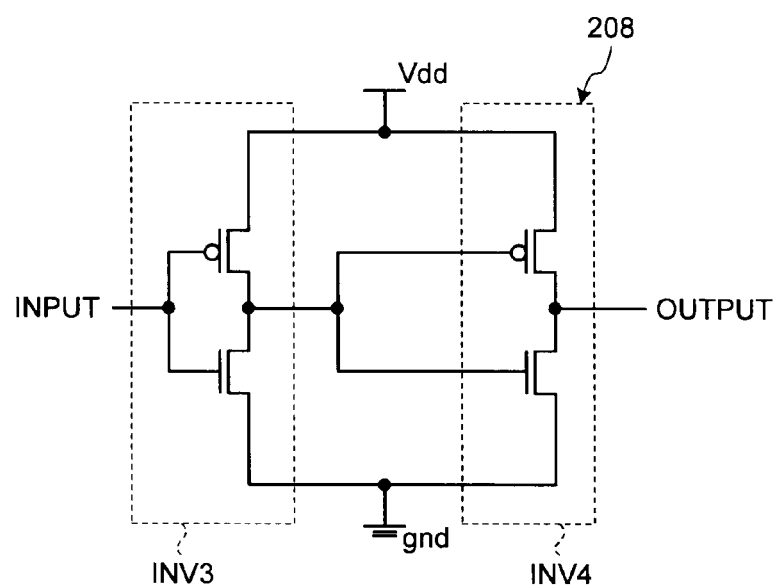

If the buffer line 105 is disposed outside the ring oscillator 201, each of a plurality of delay buffers 208-1 to 208-K in the ring oscillator 201 as shown in FIG. 17A may be one where the delay amount of a former-stage inverter unit INV3 is equal to the delay amount of a latter-stage inverter unit INV4 as shown in FIG. 17B. Also in this case, if the output duty cycle of the ring oscillator 201 is 50%, the output duty cycle of the buffer line 105 can be amplified as shown in a mathematical expression 5, for example.

$$2 \times K_L/K_R \times (t_{fall}/(t_{rise}+t_{fall})-\tfrac{1}{2})+\tfrac{1}{2} \quad \text{Mathematical Expression 5}$$

Third Embodiment

Next, a description will be given of a semiconductor integrated circuit according to a third embodiment. A description will hereinafter be given, focusing on parts that are different from the second embodiment.

The device sizes of PMOS and NMOS transistors are generally designed substantially the same in a digital circuit; however, in this case, the NMOS transistor has a larger current than the PMOS transistor. Therefore, even if the transistors can be manufactured as designed without process variations, the duty cycle may greatly deviate from 50% in the implementation of the first and second embodiments. If the duty cycle becomes 0% or 100%, it is not possible to measure; accordingly, there is a limit to the amplification shown in the second embodiment.

For example, in the configuration of the second embodiment, samples whose values of $t_{fall}/(t_{rise}+t_{fall})$ are 65% and 66% are desired to be distinguished. If $K_L/K_R=1$ in the configuration of the second embodiment, they have the duty cycles of 95% and 98%, and accordingly the difference can be amplified three times; however, if they are amplified more than that, the duty cycles exceed 100% and it becomes impossible to perform detection.

Figure 18:
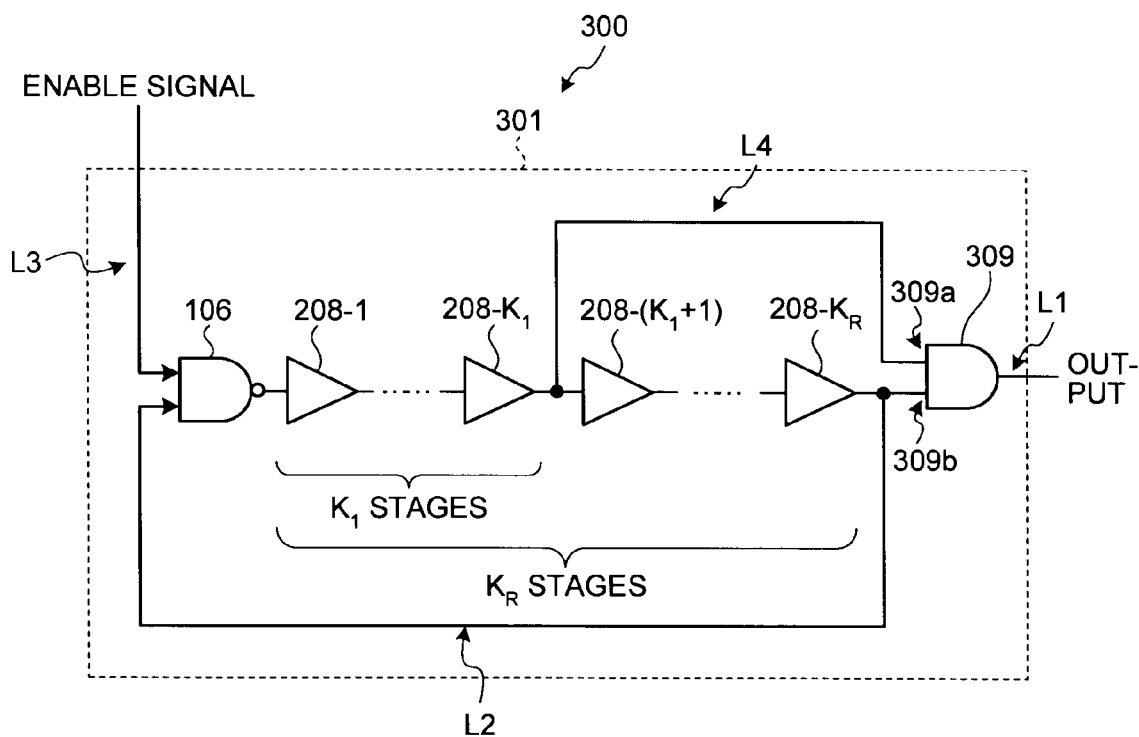
FIG. 18 is a view illustrating the configuration of a ring oscillator in a third embodiment.

Hence, the third embodiment adopts a configuration that can set an initial duty cycle output from a ring oscillator 301 to a value smaller than 50%. As shown in FIG. 18, the internal configuration of the ring oscillator 301 is different from that of the second embodiment. Specifically, the ring oscillator 301 further includes an AND circuit 309. The AND circuit 309 is disposed between an output terminal of a delay buffer 208-$K_R$ at a final stage in a plurality of delay buffers 208-1 to 208-$K_R$ and an output terminal of the ring oscillator 301. An input terminal 309a of the AND circuit 309 is connected to an output terminal of the delay buffer 208-$K_1$ at an intermediate stage (for example, a $K_1$-th stage) via a line L4, and an input terminal 309b thereof is connected to an output terminal of the delay buffer 208-$K_R$ at the final stage (for example, a $K_R$-th stage). Accordingly, the AND circuit 309 computes the AND of the output of the delay buffer 208-$K_R$ at the final stage and the output of the delay buffer 208-$K_1$ at the intermediate stage in the plurality of delay buffers 208-1 to 208-$K_R$ to output the computation result to the buffer line 105 via a line L1.

What is characteristic is an output part that ANDs the final waveform of the ring oscillator 301 and the intermediate waveform of the ring oscillator 301, and therefore it is possible to design the duty cycle of the output to a value that is not 50%. At this time, it is preferable that each delay buffer 208 should have an equal delay amount between the former-stage inverter unit and the latter-stage inverter unit as shown in FIG. 17B. Assuming that the AND is taken between the output of the delay buffer 208-$K_1$ at the $K_1$-th stage and the output of the delay buffer 208-$K_R$ at the final stage, the delay buffers being shown in FIG. 18, the duty cycle of a final output waveform is $K_1/(2K_R)$; accordingly, if the value $K_1$ is selected, the output duty cycle of the ring oscillator 301 can be arbitrarily set. For example, a selector may be disposed between the input terminal 309a of the AND circuit 309 and each of the output terminals of the plurality of delay buffers 208-1 to 208-($K_R$−1) to make is possible to arbitrarily set the number of an intermediate stage computed by the AND circuit 309.

For example, assuming that $K_1:K_R=1:5$, the output duty cycle of the ring oscillator 301 is 10%. If the buffer line 105 in the subsequent stage is designed to have a length of $K_L/K_R=2.5$, the output duty cycles of the buffer line of the above-mentioned samples whose values of $t_{fall}/(t_{rise}+t_{fall})$ are 65% and 66% are 85% and 90%, respectively; accordingly, it is possible to amplify the difference five times.

As described above, in the ring oscillator 301 in the third embodiment, the AND circuit 309 computes the AND of the outputs of the delay buffer 208-$K_R$ at the final stage and the delay buffer 208-$K_1$ at the intermediate stage in the plurality of delay buffers 208-1 to 208-$K_R$ to output the computation result to the buffer line 105 via the line L1. Accordingly, the initial duty cycle output from the ring oscillator 301 can be set to a value smaller than 50%, and therefore it is possible to amplify the duty cycle of a periodic pulse by the buffer line 105 in a state where a dynamic range for amplification is secured (for example, in an area where the first measurement unit 20 can measure easily). Accordingly, it is possible to further improve accuracy in measurement of the duty cycle of a periodic pulse and measure the difference in currents between the PMOS and NMOS transistors with higher accuracy. The buffer line 105 may be included in the ring oscillator 301. For example, all or a consecutive part of the plurality of delay buffers 208-1 to 208-$K_R$ in the ring oscillator 301 may serve as the buffer line 105. In this case, the AND circuit 309 of the ring oscillator 301 outputs the computation result to the first measurement unit 20 and the second measurement unit. This too makes it possible to set the initial duty cycle output from the ring oscillator 301 to a value smaller than 50%, and therefore it is possible to amplify the duty cycle of a periodic pulse by the buffer line 105 in the state where a dynamic range for amplification is secured (for example, in an area where the first measurement unit 20 can measure easily).

Fourth Embodiment

Next, a description will be given of a semiconductor integrated circuit according to a fourth embodiment. A description will hereinafter be given, focusing on parts that are different from the second embodiment.

Figure 19:
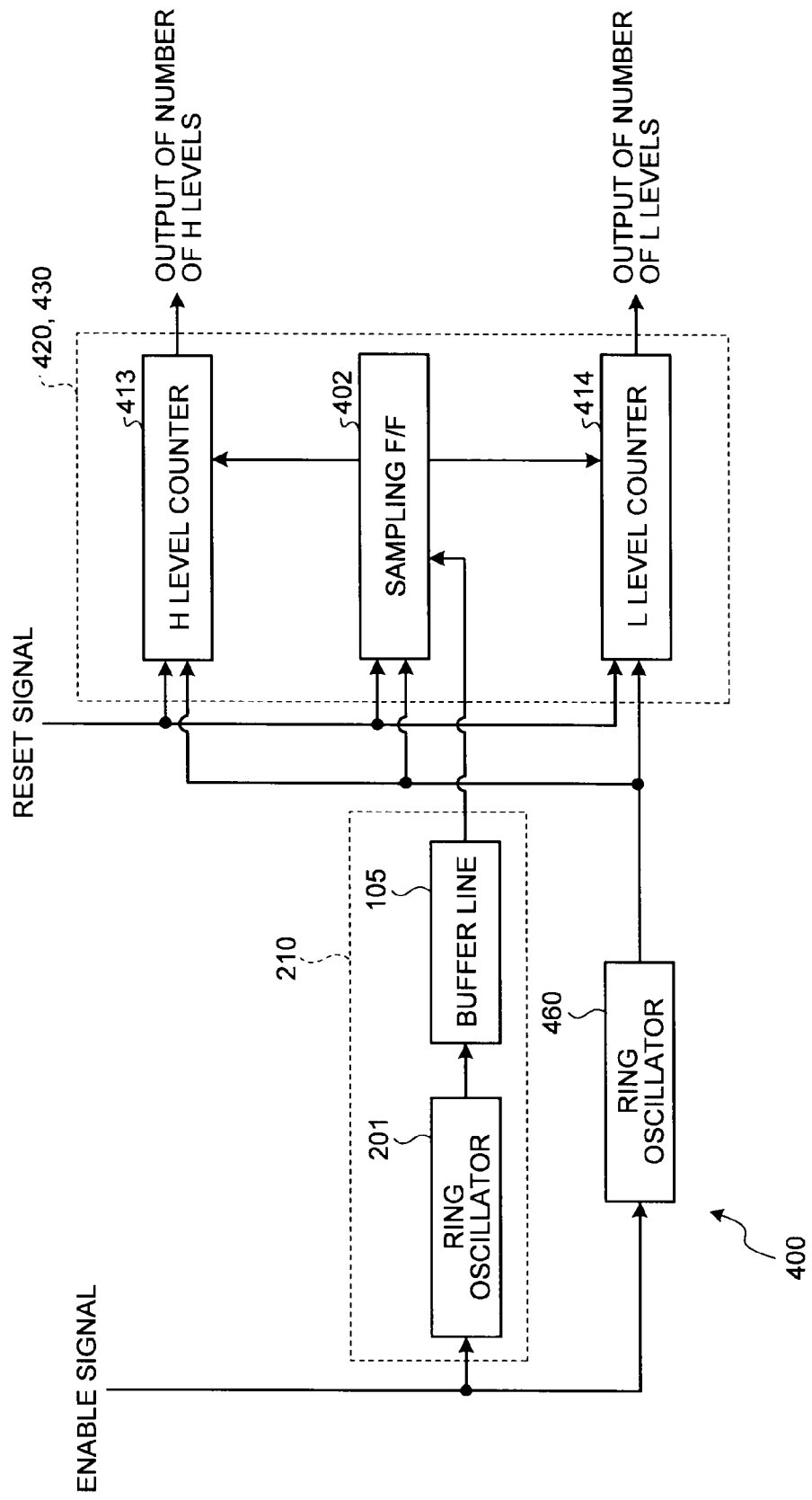
FIG. 19 is a view illustrating the configuration of an on-chip measurement circuit in a fourth embodiment.
Figure 20:
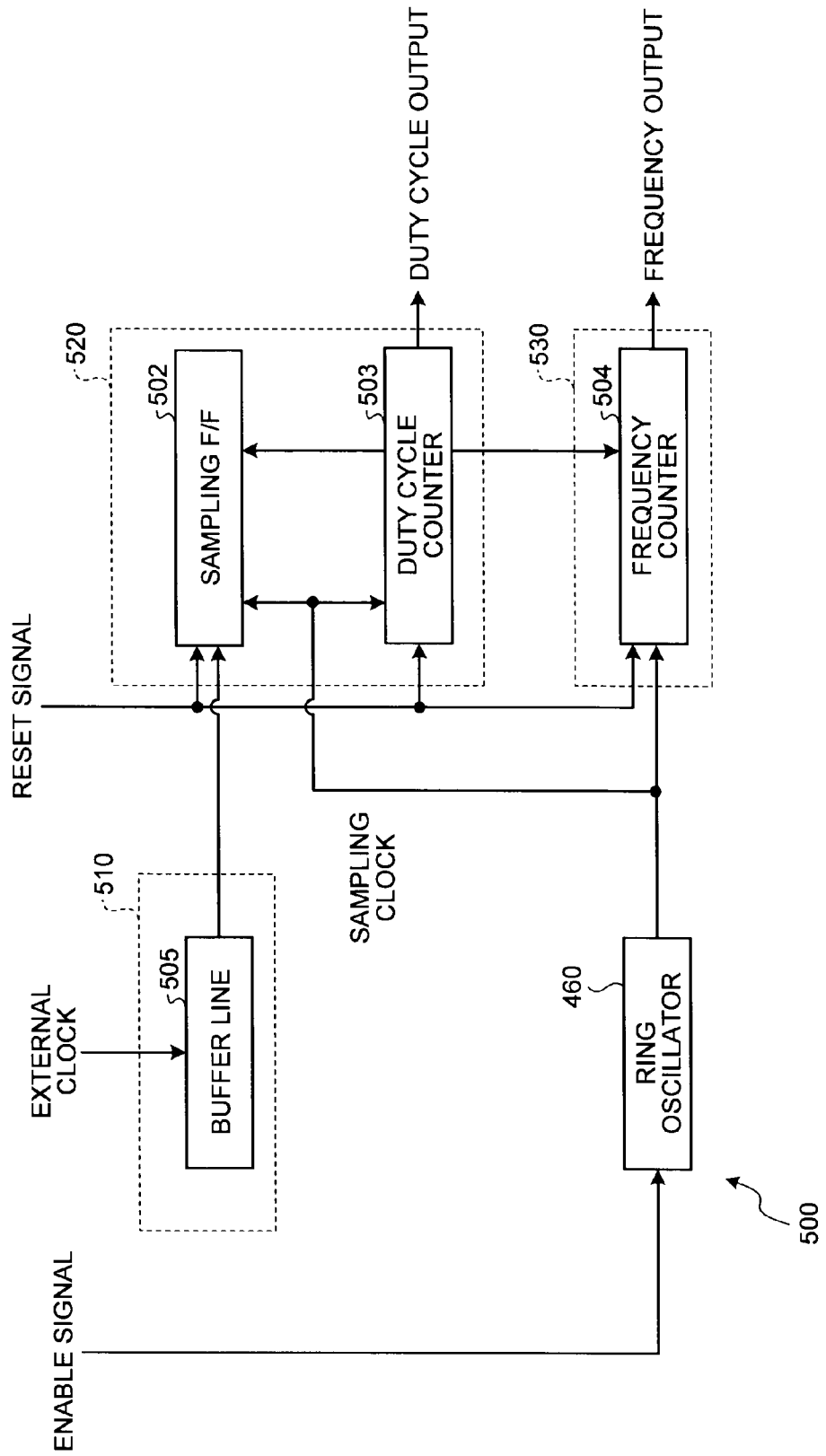
FIG. 20 is a view illustrating the configuration of an on-chip measurement circuit in a fifth embodiment.

In the fourth embodiment, sampling clocks are not acquired from the outside, but are generated inside. Specifically, as shown in FIG. 19, a measurement circuit 400 further includes a ring oscillator 460 to generate sampling clocks, and a first measurement unit 420 and a second measurement unit 430 are shared. The first measurement unit 420 and the second measurement unit 430 include a sampling flip-flop 402, an H level counter 413, and an L level counter 414.

The ring oscillator 460 generates sampling clocks to supply the sampling clocks to the sampling flip-flop 402, the H level counter 413, and the L level counter 414 respectively. The point that the cycle of a sampling clock (periodic pulse) is asynchronous to the cycle of the periodic pulse output from the unit to be measured 210 is similar to the second embodiment.

The sampling flip-flop 402 maintains the level of the periodic pulse output from the unit to be measured 210 in synchronization with the sampling clock (periodic pulse) output from the ring oscillator 460. The H level counter 413 counts the number of times that the level maintained by the sampling flip-flop 402 is the H level (the number of H levels) in synchronization with the sampling clock (periodic pulse) output from the ring oscillator 460. The L level counter 414 counts the number of times that the level maintained by the sampling flip-flop 402 is the L level (the number of L levels) in synchronization with the sampling clock (periodic pulse) output from the ring oscillator 460. The H level counter 413 and the L level counter 414 output the numbers of H levels and L levels to the subsequent stage as values indicating the duty cycle and the frequency of the periodic pulse.

In other words, it is necessary to know the number of sampling clocks, $N_S$, in order to calculate the duty cycle; however, if sampling clocks are generated inside, it is possible to take a measure by mounting the H level counter 413 and the L level counter 414 as shown in FIG. 19 instead of the frequency counter and the duty cycle counter. The H level counter 413 counts up when the output of the sampling flip-flop 402 is at H at the time of arrival of a sampling clock, and maintains the value when at L. Conversely, the L level counter 414 counts up when at L and maintains the value when at H. Such a configuration makes it possible to calculate the frequency F and the duty cycle D as in the following mathematical expressions 6 and 7.

$$F=(N_H+N_L)/T \qquad \text{Mathematical Expression 6}$$

$$D=N_H/(N_H+N_L) \qquad \text{Mathematical Expression 7}$$

However, $N_H$ denotes the number of counts after measurement by the H level counter 413, and $N_L$ denotes the number of counts after measurement by the L level counter 414. Moreover, the frequency F at this time is the frequency of not the ring oscillator 201 but the ring oscillator 460. A method for obtaining the currents of the PMOS and NMOS transistors from the frequency F and the duty cycle D is similar to that of the first embodiment.

As described above, in the fourth embodiment, the ring oscillator 460 generates sampling clocks to supply the sampling clocks to the sampling flip-flop 402, the H level counter 413, and the L level counter 414, respectively. Accordingly, even if sampling clocks cannot be supplied from the outside of the measurement circuit, the measurement circuit can measure the duty cycle and the frequency of a periodic pulse.

Moreover, in the fourth embodiment, the configuration for measuring the duty cycle of a periodic pulse and the configuration for measuring the frequency of a periodic pulse are shared; accordingly, it is possible to easily reduce the area of the circuit.

Fifth Embodiment

Figure 21:
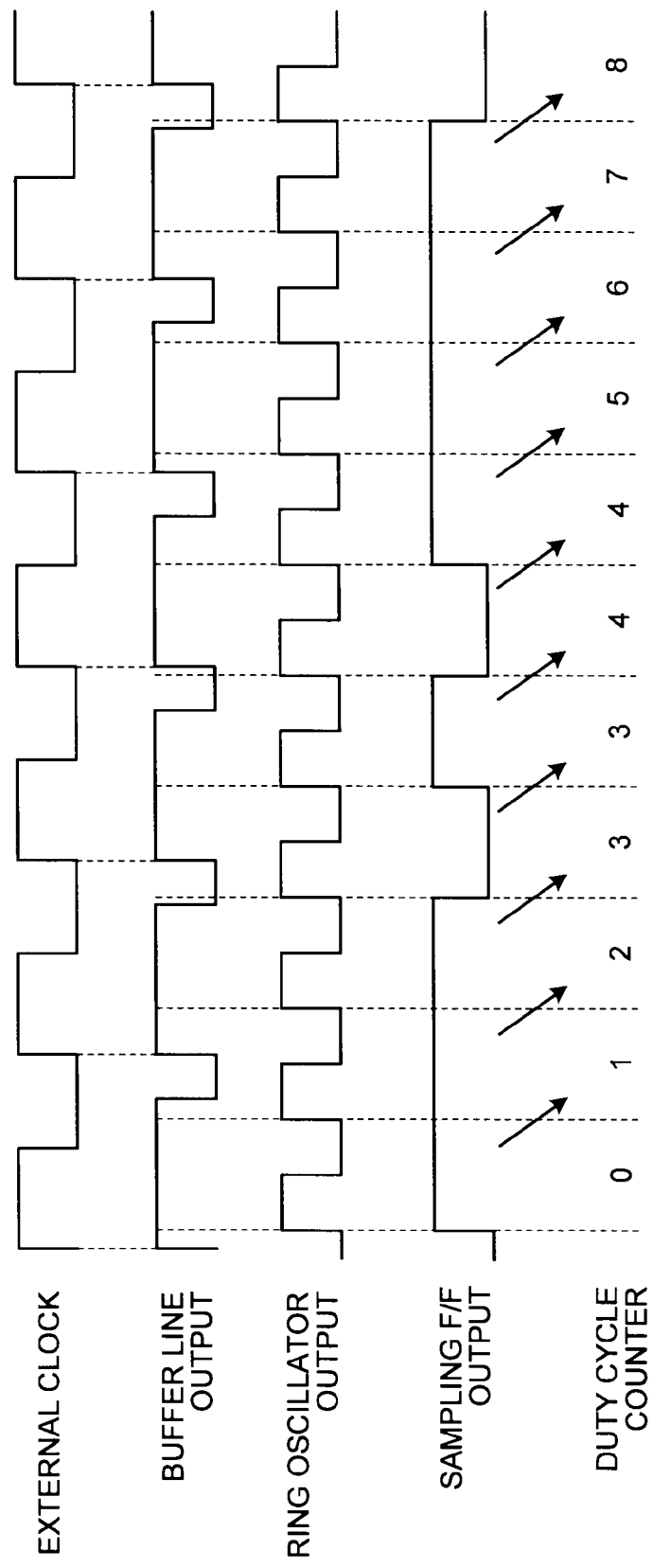
FIG. 21 is a view illustrating the operation of a duty cycle counter in the fifth embodiment.
Figure 22:
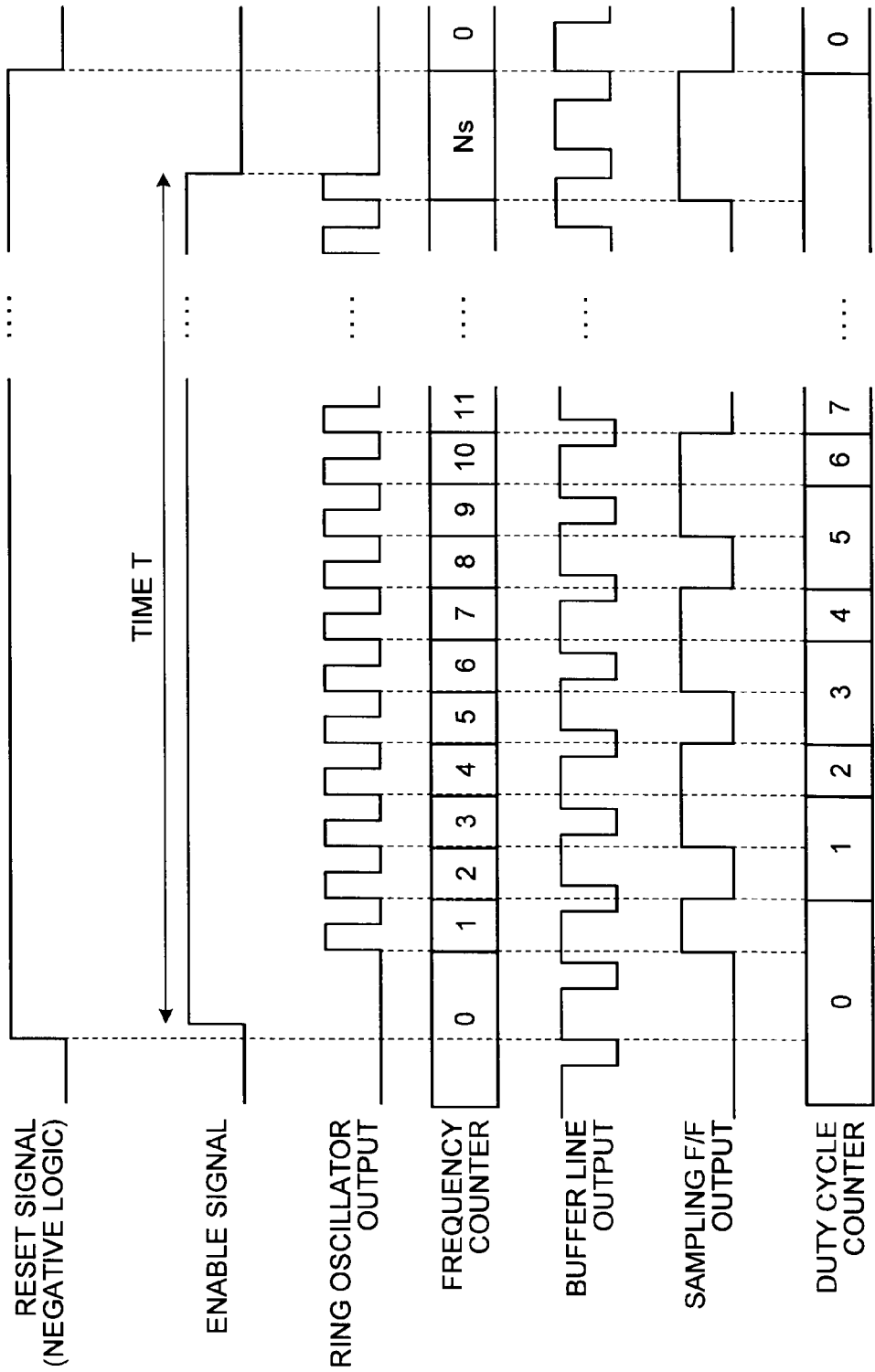
FIG. 22 is a view illustrating operations related to frequency measurement in the fifth embodiment.
Figure 23:
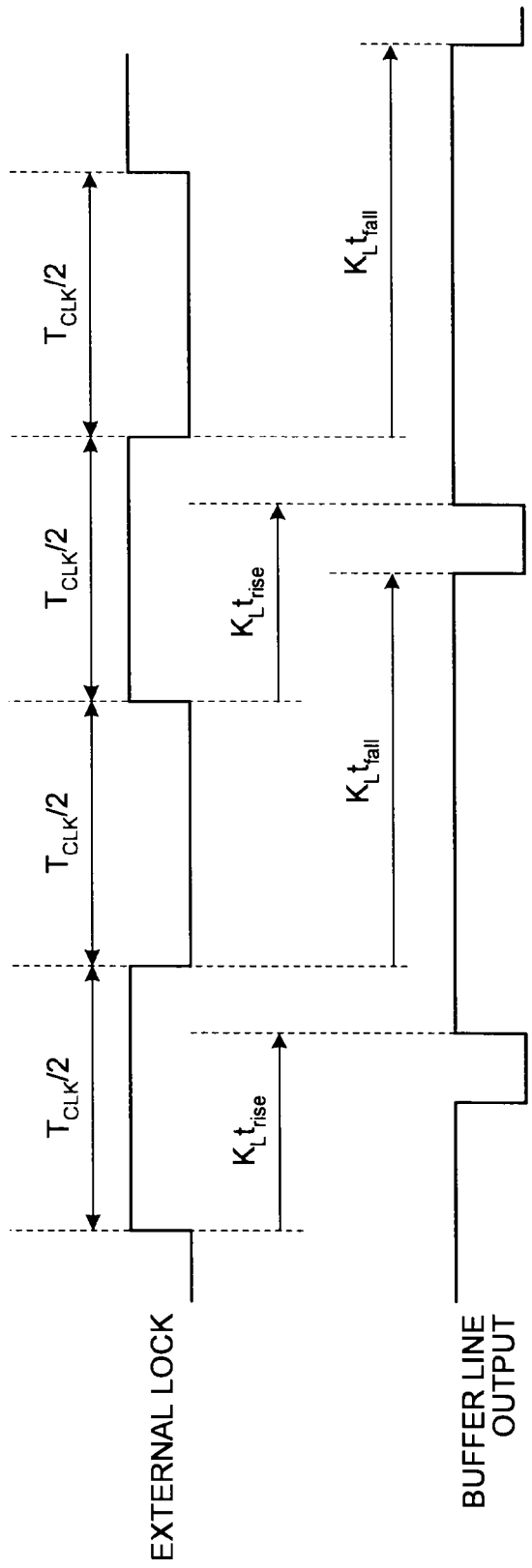
FIG. 23 is a view illustrating the operation of a buffer line in the fifth embodiment.

Next, a description will be given of a semiconductor integrated circuit according to a fifth embodiment. A description will hereinafter be given, focusing on parts that are different from the first to fourth embodiments. While a periodic pulse generated in the unit to be measured is delayed by the buffer line 105 in the first to fourth embodiments, a periodic pulse received from the outside of the unit to be measured, that is, an external clock is delayed by a buffer line 505 in the fifth embodiment. Specifically, the buffer line 505 of a unit to be measured 510 receives an external clock from the outside (for example, the clock generation unit 142 shown in FIG. 9). The received external clock is then delayed by the buffer line 505, and the duty cycle is measured by a sampling F/F 502 and a duty cycle counter 503 of a first measurement unit 520. Moreover, the ring oscillator 460 oscillates when receiving an enable signal from the outside (for example, the controller 143 shown in FIG. 9), and generates a periodic pulse. The frequency of the periodic pulse generated by the ring oscillator 460 is measured by a frequency counter 504 of a second measurement unit 530. The periodic pulse generated by the ring oscillator 460 is also used as a sampling clock at the sampling F/F 502 and the duty cycle counter 503. FIG. 21 is a waveform chart for explaining the operation of the sampling F/F 502 and the duty cycle counter 503. A clock signal used in an integrated circuit is generally generated so as to have a duty cycle of approximately 50%. If an external clock with a 50% duty cycle passes through the buffer line 505, the frequency remains the same; however, the external clock becomes a clock signal with a duty cycle in accordance with the characteristic difference between the PMOS and NMOS transistors. This duty cycle is measured by the sampling F/F 502 and the duty cycle counter 503. The measurement method is similar to those in the first to fourth embodiments, but is different from those in the first to third embodiments and is similar to the one in the fourth embodiment in respect that the sampling clocks of the sampling F/F 502 and the duty cycle counter 503 are supplied from the ring oscillator 460. Signal waveforms during measurement according to the fifth embodiment are shown in FIG. 22. The frequency counter 504 counts the number of pulses of the ring oscillator during a measurement time period, and accordingly measures the oscillation frequency of the ring oscillator. The duty cycle counter counts the number of times that the buffer line output is at H on the rising edge of the pulse of the ring oscillator; accordingly, assuming that the count result of the duty cycle counter is denoted by $N_D$, and the count result of the frequency counter is denoted by $N_S$, the frequency F and the duty cycle D are obtained as in the above mathematical expression 1 and 2, similarly to the first embodiment. A method for obtaining the current $I_{drP}$ of the PMOS transistor and the current $I_{drN}$ of the NMOS transistor from the frequency F and the duty cycle D is similar to those of the first embodiment and the like. As in the above, it is possible to obtain the duty cycle and the frequency of a periodic pulse as parameters for separately estimating the characteristic variations of the PMOS and NMOS transistors also with the configuration of the fifth embodiment, similarly to the first to fourth embodiments. Moreover, an advantage in introducing the configuration of the fifth embodiment includes that similarly to the third embodiment, the difference between the characteristics of the PMOS and NMOS transistors can be measured more accurately. Assuming that the cycle of an external clock is denoted by TCLK and a duty cycle thereof is 50%, a change in duty cycle by the buffer line is expressed as in FIG. 23. In other words, the rising and falling edges of the external clock come alternately at intervals of TCLK/2; however, the external clock passes through the buffer line with the number of stages, $K_L$, to delay the rising edge for a time $K_L t_{rise}$, and the falling edge for a time $K_L t_{fall}$. As a result, the duty cycle has a value expressed in the following mathematical expression 8.

$$D = \tfrac{1}{2} + K_L(t_{fall} - t_{rise})/T_{CLK} \quad \text{Mathematical Expression 8}$$

The more there is the number of stages, $K_L$, the more accurately the characteristic difference between the PMOS and NMOS transistors can be measured; however, it is not possible to measure unless the duty cycle is less than 100%, and accordingly the number of stages, $K_L$, has an upper limit value as shown in the following mathematical expression 9.

$$K_L < T_{CLK}/\{2(t_{fall} - t_{rise})\} \quad \text{Mathematical Expression 9}$$

It can be seen from the mathematical expression 9 that the longer the cycle $T_{CLK}$ of a clock inputted to the buffer line is, the greater the value of the number of stages, $K_L$, can be made. However, if a periodic pulse inputted to the buffer line is generated by the ring oscillator in the measurement circuit as in the first to fourth embodiments, the number of stages of the ring oscillator becomes larger to have a long cycle; accordingly, the area of the circuit increases. Therefore, a clock signal that is used on the same integrated circuit and has a long cycle is brought in from the outside to make it possible to inhibit the area from increasing and measure the characteristic difference between the PMOS and NMOS transistors with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising an on-chip measurement circuit,
   the measurement circuit comprising:
   a unit to be measured including a first ring oscillator generating a periodic pulse in a first cycle, and a buffer line delaying and outputting the periodic pulse generated by the first ring oscillator;
   a second ring oscillator generating a periodic pulse in a second cycle asynchronous to the first cycle;
   an H level counter counting the number of H levels of the periodic pulse output from the unit to be measured in synchronization with a periodic pulse output from the second ring oscillator; and
   an L level counter counting the number of L levels of the periodic pulse output from the unit to be measured in synchronization with the periodic pulse output from the second ring oscillator,
   the buffer line comprising a plurality of delay elements connected in series,
   each of the plurality of delay elements comprising:
   a former-stage inverter unit including a first PMOS transistor and a first NMOS transistor and having a first propagation delay; and
   a latter-stage inverter unit including a second PMOS transistor and a second NMOS transistor and having a second propagation delay different from the first propagation delay, a gate of the second PMOS transistor being electrically connected to a drain of the first PMOS transistor and to a drain of the first NMOS transistor, a gate of the second NMOS transistor being electrically connected to the drain of the first PMOS transistor and to the drain of the first NMOS transistor.

* * * * *